United States Patent
Paik et al.

(10) Patent No.: US 12,291,788 B2
(45) Date of Patent: May 6, 2025

(54) CORAL REEF-LIKE NICKEL PHOSPHIDE-TUNGSTEN OXIDE NANOCOMPOSITE, METHOD FOR PREPARING THE CORAL REEF-LIKE NICKEL PHOSPHIDE-TUNGSTEN OXIDE NANOCOMPOSITE AND CATALYST FOR ELECTROCHEMICAL WATER SPLITTING INCLUDING THE CORAL REEF-LIKE NICKEL PHOSPHIDE-TUNGSTEN OXIDE NANOCOMPOSITE

(71) Applicants: S-Oil Corporation, Seoul (KR); POSTECH Research and Business Development Foundation, Gyeongsangbuk-do (KR)

(72) Inventors: Sang Cheol Paik, Gyeonggi-do (KR); Kijung Yong, Gyeongsangbuk-do (KR); Dokyoung Kim, Gyeongsangbuk-do (KR)

(73) Assignees: S-OIL CORPORATION, Seoul (KR); POSTECH RESEARCH AND BUSINESS DEVELOPMENT FOUNDATION, Gyeongsangbukdo (KR)

( * ) Notice: Subject to any disclaimer, the term of this patent is extended or adjusted under 35 U.S.C. 154(b) by 104 days.

(21) Appl. No.: 17/545,412

(22) Filed: Dec. 8, 2021

(65) Prior Publication Data
US 2023/0002921 A1    Jan. 5, 2023

(30) Foreign Application Priority Data
Jul. 2, 2021  (KR) .................. 10-2021-0086941

(51) Int. Cl.
C25B 11/031    (2021.01)
C23C 14/08     (2006.01)
(Continued)

(52) U.S. Cl.
CPC .......... *C25B 11/031* (2021.01); *C23C 14/083* (2013.01); *C23C 14/24* (2013.01);
(Continued)

(58) Field of Classification Search
None
See application file for complete search history.

(56) References Cited

U.S. PATENT DOCUMENTS

2018/0135191 A1    5/2018    Kang

FOREIGN PATENT DOCUMENTS

| CN | 111957329 | 11/2020 |
|---|---|---|
| JP | 2007054742 | 3/2007 |
| KR | 20210008815 | 1/2021 |

OTHER PUBLICATIONS

Lv et al ("Oxygen vacancy improves the hydrogen evolution reaction property of WO3-x nanosheets", Nano-Structures & Nano-Objects, vol. 15, Jul. 2018, pp. 114-118) (Year: 2018).*

(Continued)

*Primary Examiner* — Alexander W Keeling
(74) *Attorney, Agent, or Firm* — DUANE MORRIS LLP; Gregory M. Lefkowitz; Brandon A. Chan

(57) ABSTRACT

A coral reef-like nickel phosphide-tungsten oxide nanocomposite is disclosed. The coral reef-like nickel phosphide-tungsten oxide nanocomposite has a structure in which algae-like transition metal-doped nickel phosphide nanosheets are deposited on coral-like tungsten oxide nanostructures grown vertically on a substrate. This structure allows the coral reef-like nickel phosphide-tungsten oxide nanocomposite to have a large surface area, which leads to a significant increase in the number of catalytic active sites, and ensures high conductivity and electrochemical stability of the coral reef-like nickel phosphide-tungsten oxide nanocomposite. Due to these advantages, the coral reef-like (Continued)

nickel phosphide-tungsten oxide nanocomposite has a low overpotential and superior hydrogen evolution reaction or oxygen evolution reaction efficiency when applied to a water splitting catalyst under alkaline conditions. Also disclosed are a method for preparing the coral reef-like nickel phosphide-tungsten oxide nanocomposite and a catalyst for electrochemical water splitting including the coral reef-like nickel phosphide-tungsten oxide nanocomposite.

26 Claims, 30 Drawing Sheets

(51) Int. Cl.
    *C23C 14/24*     (2006.01)
    *C23C 28/04*     (2006.01)
    *C25B 1/04*     (2021.01)
    *C25B 11/02*     (2021.01)
    *C25B 11/053*     (2021.01)
    *C25B 11/061*     (2021.01)
    *C25B 11/091*     (2021.01)
    *C25D 9/08*     (2006.01)

(52) U.S. Cl.
    CPC .............. *C23C 28/042* (2013.01); *C25B 1/04* (2013.01); *C25B 11/02* (2013.01); *C25B 11/053* (2021.01); *C25B 11/061* (2021.01); *C25B 11/091* (2021.01); *C25D 9/08* (2013.01)

(56) References Cited

OTHER PUBLICATIONS

Wang et al ("Construction of a self-supporting Ni2P-WO3 heterostructure for highly efficient hydrogen evolution under both caustic and acidic conditions", Sustainable Energy Fuels, Apr. 2021, 5, 2884-2892) (Year: 2021).*

Xu et al ("Three-dimensional (3D) hierarchical coral-like Mn-doped Ni2PeNi5P4/NF catalyst for efficient oxygen evolution", Journal of Alloys and Compounds, vol. 826, Jun. 15, 2020, 154210, pp. 1-8) (Year: 2020).*

Mohamed et al ("Synthesis of hexagonal WO3 nanocrystals with various morphologies and their enhanced electrocatalytic activities toward hydrogen evolution", International Journal of Hydrogen Energy, vol. 44, Issue 10, Feb. 22, 2019, pp. 4724-4736) (Year: 2019).*

Gholamvand et al ("Electrochemical Applications of Two-Dimensional Nanosheets: The Effect of Nanosheet Length and Thickness", Chem. Mater. 2016, 28, 8, 2641-2651) (Year: 2016).*

Zhang et al ("Psesudocubic Phase Tungsten Oxide as a Photocatalyst for Hydrogen Evolution Reaction", ACS Appl. Energy Mater. 2019, 2, 8792-8800) (Year: 2019).*

Sun et al ("Mo doped Ni2P nanowire arrays: an efficient electrocatalyst for the hydrogen evolution reaction with enhanced activity at all pH values", Nanoscale, 2017, 9, 16674) (Year: 2017).*

Xiong et al ("Understanding the doping effect on hydrogen evolution activity of transition-metal phosphides: Modeled with Ni2P", Applied Catalysis B: Environmental 295, May 2021, 120283, pp. 1-10 and the Supporting Information). (Year: 2021).*

Wu, Xingqiang, et al., "NiCo/Ni/CuO nanosheets/nanowires on copper foam as an efficient and durable electrocatalyst for oxygen evolution reaction," International Journal of Hydrogen Energy, 2020, vol. 45, pp. 21354-21363.

Baek, Y., et al., "Controlled Growth and Characterization of Tungsten Oxide Nanowires Using Thermal Evaporation of WO3 Powder," J. Phys. Chem. C, 2007, vol. 111, pp. 1213-1218.

Abstract Booklet, "Chemical Nanosciences and Nanotechnology Early Career Virtual Poster Symposium," Royal Society of Chemistry, Chemical Nanoscience and Nanotechnology Group, Mar. 24, 2021.

Kim, D., et al., "Biomimetic 2D-Ni(Co,Fe)P/1D-WOx nanocoral reef electrocatalysts for efficient water splitting," J. Mater. Chem. A, 2021, 9, 10909.

"Chemical Engineering for a Suitable Society in the New Normal Era," 2021 KIChE Spring Meeting, Apr. 21, 2021.

Ma, B., et al., "Nickel cobalt phosphide with three-dimensional nanostructure as a highly efficient electrocatalyst for hydrogen evolution reaction in both acidic and alkaline electrolytes," Nano Research, 2016, 12(2); 375-380.

\* cited by examiner

CORAL REEF-LIKE NICKEL PHOSPHIDE-TUNGSTEN OXIDE NANOCOMPOSITE, METHOD FOR PREPARING THE CORAL REEF-LIKE NICKEL PHOSPHIDE-TUNGSTEN OXIDE NANOCOMPOSITE AND CATALYST FOR ELECTROCHEMICAL WATER SPLITTING INCLUDING THE CORAL REEF-LIKE NICKEL PHOSPHIDE-TUNGSTEN OXIDE NANOCOMPOSITE

CROSS-REFERENCE TO RELATED APPLICATIONS

This application claims priority under 35 U.S.C. § 119 to Korean Patent Application No. 10-2021-0086941 filed on Jul. 2, 2021 in the Korean Intellectual Property Office, the disclosure of which is incorporated herein by reference in its entirety.

BACKGROUND OF THE INVENTION

1. Field of the Invention

The present invention relates to a coral reef-like nickel phosphide-tungsten oxide nanocomposite, a method for preparing the coral reef-like nickel phosphide-tungsten oxide nanocomposite, and a catalyst for electrochemical water splitting including the coral reef-like nickel phosphide-tungsten oxide nanocomposite.

2. Description of the Related Art

Environmental destruction and the depletion of fossil fuels has urgently stimulated the need for developing clean and sustainable renewable energies. Among various ecofriendly energy candidates, hydrogen is considered an attractive energy storage source for transportation due to its high energy density. However, most hydrogen is currently produced by a steam reforming process, which inevitably causes issues due to the generation of $CO_2$.

Water electrolysis is an alternative, promising method to generate green hydrogen owing to its high efficiency and complete carbon-free characteristics. Key components of water electrolysis systems are the hydrogen evolution reaction (HER) and oxygen evolution reaction (OER) catalysts, whose electrocatalytic activities mainly determine the performances of devices. Pt-, Ir- and Ru-related noble materials are generally regarded as the most efficient HER/OER catalysts, but their high cost and low durability are bottlenecks in commercializing water electrolysis.

Various transition metal compounds have been studied as alternatives to noble metal catalysts owing to their natural abundances and appreciable catalytic activities. In particular, transition metal-nickel phosphide catalysts were shown to have enhanced catalytic activity in water splitting, resulting from the optimized electronic structures of transition metals and nickel. However, their catalytic activities were still far from those of noble metals, which was mainly due to the limited number of active sites and poor conductivity.

Thus, there is a need to investigate and develop new materials that can avoid the problems of a limited number of catalytic active sites and low conductivity encountered in conventional transition metal-based non-noble metal catalysts.

PRIOR ART DOCUMENTS

Patent Documents (Patent Document 1) Korean Patent No. 10-1670860

SUMMARY OF THE INVENTION

The present invention has been made in an effort to solve the above-described problems, and one object of the present invention is to provide a coral reef-like nickel phosphide-tungsten oxide nanocomposite that has an increased number of catalytic active sites and is highly conductive and electrochemically stable.

A further object of the present invention is to provide a catalyst for electrochemical water splitting including the coral reef-like nickel phosphide-tungsten oxide nanocomposite.

Another object of the present invention is to provide an electrode including the catalyst for electrochemical water splitting.

Another object of the present invention is to provide an electrochemical water splitting system including the electrode, a counter electrode, and an electrolyte or ionic liquid.

Still another object of the present invention is to provide a method for preparing a coral reef-like nickel phosphide-tungsten oxide nanocomposite.

The present invention provides a coral reef-like nickel phosphide-tungsten oxide nanocomposite including a substrate, a core including a plurality of tungsten oxide nanostructures grown vertically on the substrate, and a shell including transition metal-doped nickel phosphide nanosheets covering a portion or the entirety of the surface of the core.

The present invention also provides a catalyst for electrochemical water splitting including the coral reef-like nickel phosphide-tungsten oxide nanocomposite.

The present invention also provides an electrode including the catalyst for electrochemical water splitting.

The present invention also provides an electrochemical water splitting system including the electrode, a counter electrode, and an electrolyte or ionic liquid.

The present invention also provides a method for preparing a coral reef-like nickel phosphide-tungsten oxide nanocomposite, including: introducing a tungsten oxide precursor on a substrate, followed by primary thermal treatment under vacuum conditions to form a core including a plurality of tungsten oxide nanostructures grown along a vertical direction on the substrate; introducing a nickel precursor and a transition metal precursor on the tungsten oxide nanostructures, followed by electrodeposition to form a nickel hydroxide-tungsten oxide intermediate in which a shell including transition metal-doped nickel hydroxide nanosheets is deposited on the tungsten oxide nanostructures; and introducing a phosphorus precursor into the nickel hydroxide-tungsten oxide intermediate, followed by secondary thermal treatment.

The coral reef-like nickel phosphide-tungsten oxide nanocomposite of the present invention has a structure in which algae-like transition metal-doped nickel phosphide nanosheets are deposited on coral-like tungsten oxide nanostructures grown vertically on a substrate. This structure allows the coral reef-like nickel phosphide-tungsten oxide nanocomposite to have a large surface area, which leads to a significant increase in the number of catalytic active sites, and ensures high conductivity and electrochemical stability of the coral reef-like nickel phosphide-tungsten oxide nanocomposite. Due to these advantages, the coral reef-like nickel phosphide-tungsten oxide nanocomposite has a low overpotential and superior hydrogen evolution reaction or oxygen evolution reaction efficiency when applied to a water splitting catalyst under alkaline conditions.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1A:
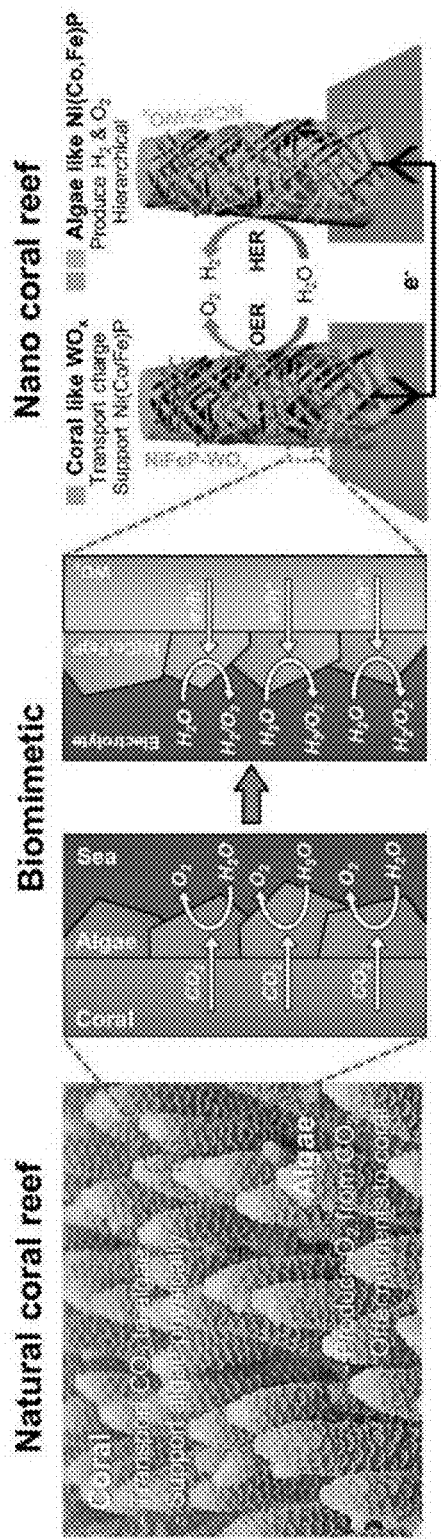
FIG. 1A shows a coral reef-like nickel phosphide-tungsten oxide nanocomposite of the present invention, which is prepared by mimicking a natural coral reef.

The present invention will now be described in more detail by way of one embodiment.

The present invention is directed to a coral reef-like nickel phosphide-tungsten oxide nanocomposite, a method for preparing the coral reef-like nickel phosphide-tungsten oxide nanocomposite, and a catalyst for electrochemical water splitting including the coral reef-like nickel phosphide-tungsten oxide nanocomposite.

As described above, non-noble metal catalysts based on transition metal compounds have been studied as alternatives to noble metal catalysts but their catalytic activities were still far from those of noble metals, which was mainly due to the limited number of active sites and poor conductivity.

Thus, the present inventors employed a biomimetic strategy to enhance the conductivity and number of active sites for developing efficient water splitting electrocatalysts. Inspired by natural coral reefs, the present inventors synthesized coral reef-like nickel phosphide-tungsten oxide nanocomposites by mimicking their structures and functions of natural coral reefs. A coral reef normally has mutual symbiotic coral and algae. Corals are composed of a solid, elongated wire-shaped calcium carbonate skeleton and provide algae with both $CO_2$ from respiration and a physical habitat. Algae are plate-shaped seaweeds that are bound on corals, synthesizing $O_2$ and nutrients through photosynthesis, while utilizing $CO_2$ provided from corals and water in the sea.

The coral reef-like nickel phosphide-tungsten oxide nanocomposite of the present invention has a structure in which algae-like transition metal-doped nickel phosphide nanosheets are deposited on coral-like tungsten oxide nanostructures grown vertically on a substrate. This structure allows the coral reef-like nickel phosphide-tungsten oxide nanocomposite to have a large surface area, which leads to a significant increase in the number of catalytic active sites, and ensures high conductivity and electrochemical stability of the coral reef-like nickel phosphide-tungsten oxide nanocomposite. Due to these advantages, the coral reef-like nickel phosphide-tungsten oxide nanocomposite has a low overpotential and superior hydrogen evolution reaction or oxygen evolution reaction efficiency when applied to a water splitting catalyst under alkaline conditions. That is, charges are transported from the tungsten oxide nanostructures through the transition metal-doped nickel phosphide nanosheets having numerous active sites and react with an aqueous electrolyte. This charge transfer ensures high water electrolysis efficiency.

Specifically, the present invention provides a coral reef-like nickel phosphide-tungsten oxide nanocomposite including a substrate, a core including a plurality of tungsten oxide nanostructures grown vertically on the substrate, and a shell including transition metal-doped nickel phosphide nanosheets covering a portion or the entirety of the surface of the core.

The coral reef-like nickel phosphide-tungsten oxide nanocomposite may have a coral reef structure in which algae-like transition metal-doped nickel phosphide nanosheets are deposited on coral-like tungsten oxide nanostructures. The tungsten oxide of the core effectively transports charges ($e^-/h^+$) to the transition metal-doped nickel phosphide nanosheets of the shell through a 1D directional structure. The shell covering a portion or the entirety of the surface of the core forms an ultrathin 2D structure and can provide active sites for splitting water molecules into $H_2$ and $O_2$.

The substrate is preferably made of a highly conductive material that can promote gas diffusion and provide more active sites. The substrate is preferably a nickel foam but is not limited thereto.

The tungsten oxide of the core is coral-like in shape and can serve to effectively transport charges ($e^-/h^+$) to the transition metal-doped nickel phosphide nanosheets of the shell through a 1D directional structure. The tungsten oxide nanostructures may be in the form of nanowires, nanotubes or nanorods. The tungsten oxide nanostructures are preferably in the form of nanowires.

The tungsten oxide nanostructures may have an average length of 20 to 100 μm and a thickness of 0.5 to 10 μm. The average length is preferably 30 to 60 μm, most preferably 45 to 55 μm, and the thickness is preferably 1 to 7 μm, most preferably 1.5 to 2.5 μm. If the average length is less than 20 μm or the thickness is less than 0.5 μm, the reduced surface area may lead to a reduction in the number of active sites, causing deterioration of catalytic activity. Meanwhile, if the average length exceeds 100 μm or the thickness exceeds 10 μm, the excessively grown tungsten oxide nanostructures may collapse during the reaction because of their poor physical stability.

The tungsten oxide nanostructures have a layered structure and an interplanar distance (d-spacing) of 0.1 to 0.6 nm, preferably 0.2 to 0.5 nm, most preferably 0.31 to 0.42 nm, as measured by X-ray diffraction. Specifically, the tungsten oxide nanostructures may be selected from the group consisting of $WO_3$, $WO_2$, and $W_{18}O_{49}$ nanostructures. The tungsten oxide nanostructures are preferably $WO_3$ nanostructures.

The transition metal-doped nickel phosphide nanosheets of the shell cover a portion or the entirety of the surface of the core, form an ultrathin 2D structure shape, and can serve to provide active sites for splitting water molecules into $H_2$ and $O_2$. The transition metal-doped nickel phosphide nanosheets have a structure in which a portion or the entirety of the surface of the nickel phosphide nanosheets is doped with a transition metal. The transition metal may be selected from the group consisting of Co, Fe, Mo, and mixtures thereof and is preferably Co or Fe.

The transition metal is doped in an amount of 1 to 10 atomic %, preferably 2 to 8 atomic %, most preferably 3.31 to 7.22 atomic %, based on 100 atomic % of the coral reef-like nickel phosphide-tungsten oxide nanocomposite. If the amount of the transition metal doped is less than 1 atomic %, low conductivity and poor catalytic activity may be caused. Meanwhile, if the amount of the transition metal doped exceeds 10 atomic %, the excessive doping of the transition metal to the nickel phosphide may interfere with the catalytic reaction.

The nickel phosphide of the transition metal-doped nickel phosphide nanosheets may be NiP, $Ni_2P$ or a mixture thereof and is preferably $Ni_2P$. Particularly, since P in $Ni_2P$ is more negatively charged (−0.07 eV) than P in other nickel phosphides, it serves as a space for ion adsorption to the surface during the hydrogen evolution reaction or oxygen evolution reaction, bringing about an improvement in performance.

The amount of metal atoms in the shell is 25 to 45 atomic %, preferably 30 to 43 atomic %, more preferably 33 to 41 atomic %, most preferably 36 to 40 atomic %, based on 100 atomic % of the coral reef-like nickel phosphide-tungsten oxide nanocomposite. If the amount of metal atoms in the shell is less than 25 atomic %, the shell may not sufficiently accept charges ($e^-/h^+$) transported from the tungsten oxide of the core, and as a result, efficient water splitting may not be achieved. Meanwhile, if the amount of metal atoms in the shell exceeds 45 atomic %, charges ($e^-/h^+$) may be excessively transported, causing overloading of the electrode during water splitting.

The present invention also provides a catalyst for electrochemical water splitting including the coral reef-like nickel phosphide-tungsten oxide nanocomposite.

The catalyst for electrochemical water splitting may be a catalyst for the hydrogen evolution reaction or oxygen evolution reaction.

When the catalyst for electrochemical water splitting is used as a catalyst for the hydrogen evolution reaction, the coral reef-like nickel phosphide-tungsten oxide nanocomposite may include cobalt (Co)-doped nickel phosphide nanosheets.

When the catalyst for electrochemical water splitting is used as a catalyst for the oxygen evolution reaction, the coral reef-like nickel phosphide-tungsten oxide nanocomposite may include iron (Fe)-doped nickel phosphide nanosheets.

The present invention also provides an electrode including the catalyst for electrochemical water splitting.

The present invention also provides an electrochemical water splitting system including the electrode, a counter electrode, and an electrolyte or ionic liquid.

The present invention also provides a method for preparing a coral reef-like nickel phosphide-tungsten oxide nanocomposite, including: introducing a tungsten oxide precursor on a substrate, followed by primary thermal treatment under vacuum conditions to form a core including a plurality of tungsten oxide nanostructures grown along a vertical direction on the substrate; introducing a nickel precursor and a transition metal precursor on the tungsten oxide nanostructures, followed by electrodeposition to form a nickel hydroxide-tungsten oxide intermediate in which a shell including transition metal-doped nickel hydroxide nanosheets is deposited on the tungsten oxide nanostructures; and introducing a phosphorus precursor into the nickel hydroxide-tungsten oxide intermediate, followed by secondary thermal treatment.

Figure 1B:
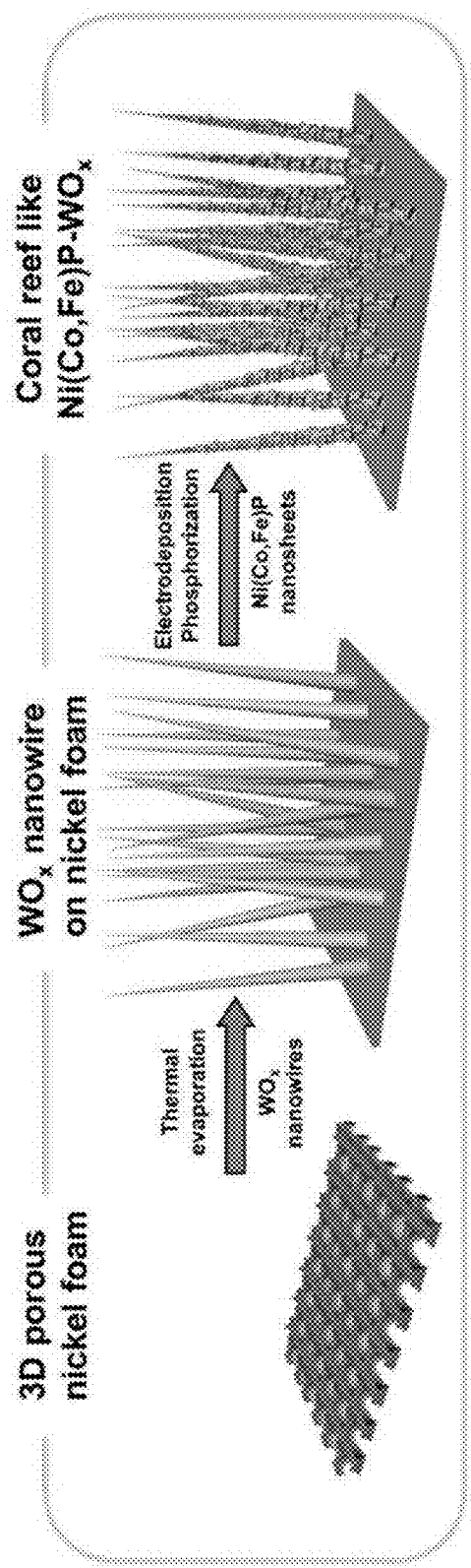
FIG. 1B shows a schematic flow diagram illustrating a method for preparing the coral reef-like nickel phosphide-tungsten oxide nanocomposite according to the present invention.
Figure 2A:
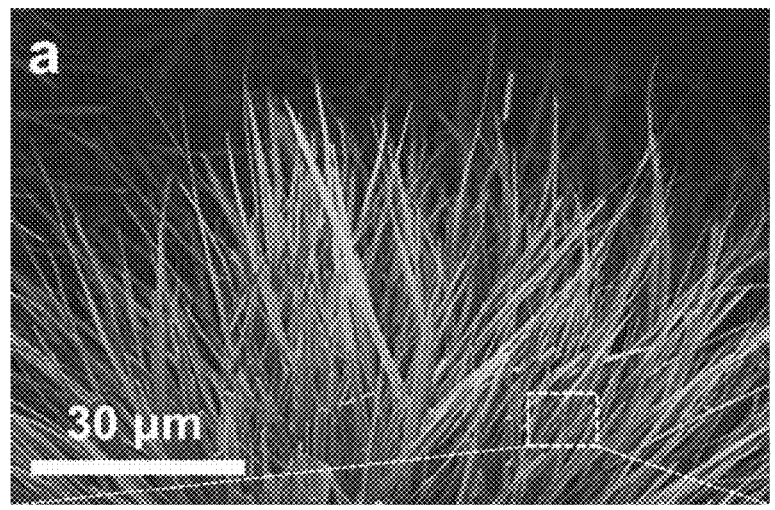
FIGS. 2A to 2D show low- and high-magnification SEM images of $WO_x/NF$ NW corals (FIG. 2A and FIG. 2C) and $NiCoP—WO_x/NF$ algae (FIG. 2B and FIG. 2D) prepared in Example 1.
Figure 2B:
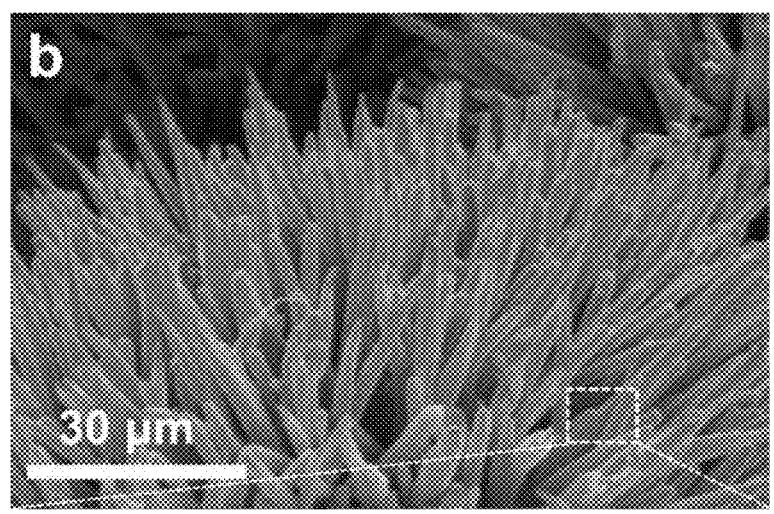
Figure 2C:
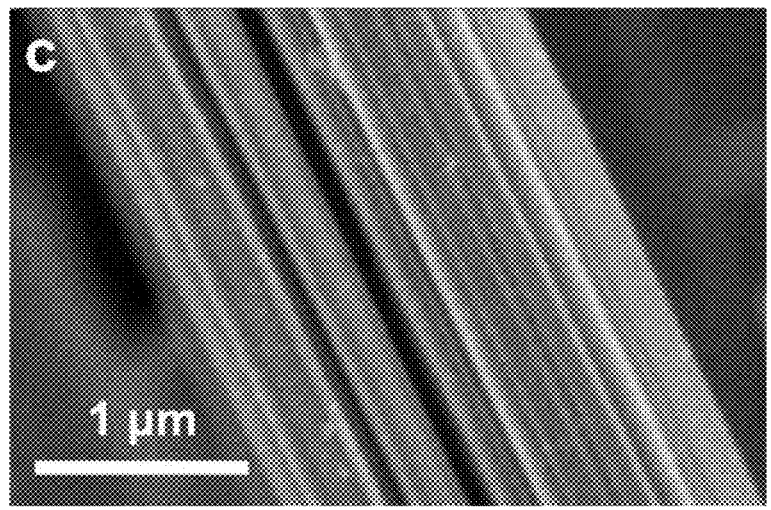
Figure 2D:
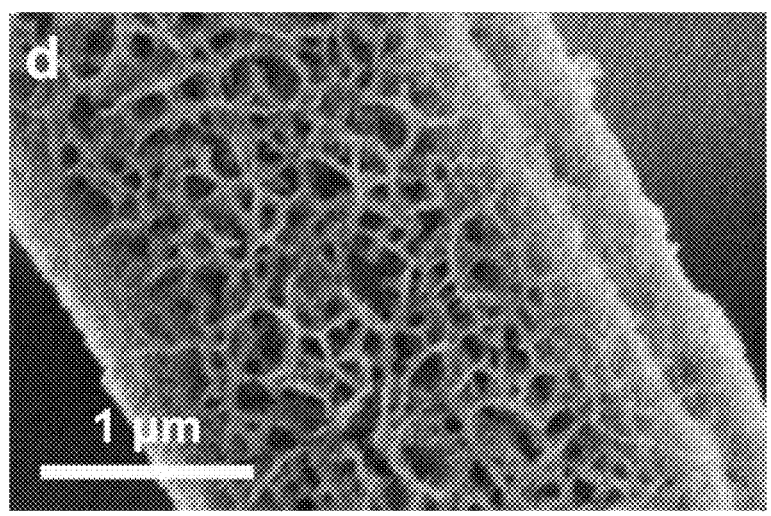

FIG. 1A shows the coral reef-like nickel phosphide-tungsten oxide nanocomposite of the present invention and FIG. 1B shows a schematic flow diagram illustrating the method for preparing the coral reef-like nickel phosphide-tungsten oxide nanocomposite according to the present invention. The coral reef-like nickel phosphide-tungsten oxide nanocomposite is prepared by mimicking a natural coral reef. Referring to FIG. 1A, the coral reef-like nickel phosphide-tungsten oxide nanocomposite mimics a natural coral reef including corals and algae, wherein the tungsten oxide nanostructures act as the corals and the transition metal-doped nickel oxide nanosheets act as the algae. The tungsten oxide nanostructures of the core are densely grown on a nickel foam and effectively transport charges ($e^-/h^+$) to the transition metal-doped nickel oxide nanosheets of the shell through a 1D directional structure.

Referring to FIG. 1B, tungsten oxide nanostructures are grown vertically on a 3D porous nickel foam by thermal evaporation and a shell including transition metal-doped nickel phosphide nanosheets is deposited to cover a portion or the entirety of the surface of a core including the tungsten oxide nanostructures by electrodeposition and phosphorization.

A detailed description will be given of the individual steps of the method according to the present invention.

First, a tungsten oxide precursor is introduced on a substrate, followed by primary thermal treatment under vacuum conditions to form a core including a plurality of uniformly sized tungsten oxide nanostructures grown along a vertical direction on the substrate. The tungsten oxide precursor may be selected from the group consisting of $WO_3$, $WO_2$, $W_{18}O_{49}$, and mixtures thereof and is preferably $WO_3$.

The core including tungsten oxide nanostructures may be grown by thermal evaporation. The thermal evaporation may be performed for 30 minutes to 2 hours after heating to 800 to 1200° C. at a ramp rate of 10 to 25° C./min under a vacuum of 0.07 mbar or less. The thermal evaporation is preferably performed for 40 minutes to 80 minutes after heating to 1000 to 1100° C. at a ramp rate of 13 to 20° C./min. The thermal evaporation is most preferably performed for 50 minutes to 70 minutes after heating to 1000 to 1100° C. at a ramp rate of 17 to 18° C./min. The vacuum state is preferably maintained at 0.07 mbar or less, most preferably 0.06 mbar or less. If the pressure is higher than 0.07 mbar, the $WO_x$ is excessively oxidized, resulting in a decrease in the number of oxygen vacancies. The decreased oxygen vacancies lead to a reduction in the conductivity of the $WO_x$, resulting in a deterioration in catalytic activity. If none of the thermal evaporation rate, vacuum state, temperature, and time conditions is met, the tungsten oxide nanostructures may be non-uniform in size and grow unevenly, resulting in a reduction in the surface area of the catalyst and impeding charge transfer or deteriorating the activity of the catalyst.

Next, a nickel precursor and a transition metal precursor are introduced on the tungsten oxide nanostructures, followed by electrodeposition to form a nickel hydroxide-tungsten oxide intermediate in which a shell including transition metal-doped nickel hydroxide nanosheets is deposited on the tungsten oxide nanostructures.

The nickel precursor may be selected from the group consisting of nickel acetate, nickel halides, nickel nitrate, nickel chloride hexahydrate, nickel carbonyl complexes, and mixtures and is preferably nickel chloride hexahydrate ($NiCl_2·6H_2O$).

The transition metal precursor may be $MCl_x·6H_2O$ or $M(NO_3)_x·6H_2O$ (where M is Fe, Co, Mo or V and x is $1 \leq x \leq 10$). The transition metal precursor is preferably $FeCl_3·6H_2O$ or $CoCl_2·6H_2O$.

The nickel precursor and the transition metal precursor may be mixed in a molar ratio of 1:1 to 6:1, preferably 1.5:1 to 5:1, most preferably 2:1 to 4:1. If the content of the nickel precursor is less than the lower limit, the transition metal may be excessively doped to a nickel phosphide, resulting in a deterioration in catalytic activity. Meanwhile, if the content of the nickel precursor exceeds the upper limit, low conductivity and poor electrochemical stability may be caused.

As a result of the electrodeposition, the nickel precursor and the transition metal precursor can be ionized, enabling the deposition of the transition metal-doped nickel hydroxide in the form of nanosheets on the surface of the tungsten oxide nanostructures. The electrodeposition may be performed at −1.3 to −0.7 V for 100 to 500 seconds, preferably at −1.1 to −0.9 V for 250 to 350 seconds.

Finally, a phosphorus precursor is introduced into the nickel hydroxide-tungsten oxide intermediate, followed by secondary thermal treatment to prepare the coral reef-like nickel phosphide-tungsten oxide nanocomposite.

The phosphorus precursor may be selected from the group consisting of sodium hypophosphite ($NaPO_2H_2·H_2O$), phosphate ($H_3PO_4$), monoammonium phosphate ($NH_4H_2PO_4$), diammonium phosphate (($NH_4)_2HPO_4$), triethylphosphine (($C_2H_5)_3P$), trimethylphosphine (($CH_3)_3P$), and mixtures thereof and is preferably sodium hypophosphite ($NaPO_2H_2·H_2O$).

The transition metal may be doped in an amount of 1 to 10 atomic %, preferably 2 to 8 atomic %, most preferably 3.31 to 7.22 atomic %, based on 100 atomic % of the coral reef-like nickel phosphide-tungsten oxide nanocomposite.

The amount of metal atoms in the shell may be 25 to 45 atomic %, preferably 30 to 43 atomic %, more preferably 33 to 41 atomic %, most preferably 36 to 40 atomic %, based on 100 atomic % of the coral reef-like nickel phosphide-tungsten oxide nanocomposite.

The secondary thermal treatment is performed for phosphorization under an inert atmosphere at 100 to 500° C. for 1 to 3 hours, preferably at 160 to 410° C. for 1.4 to 2.6 hours, most preferably 280 to 320° C. for 1.8 to 2.2 hours. If the temperature and time conditions for the secondary thermal treatment are outside the respective ranges defined above, aggregation tends to occur on the catalyst surface.

Particularly, although not explicitly described in the Examples section that follows, coral reef-like nickel phosphide-tungsten oxide nanocomposites were prepared by varying the following 13 conditions, catalysts for the hydrogen evolution reaction and catalysts for the oxygen evolution reaction including the nanocomposites were fabricated, electrochemical water splitting systems including the catalysts were manufactured, the amounts of hydrogen and oxygen evolved from the catalysts in alkaline electrolytes and the hydrogen and oxygen evolution rates were measured by suitable methods known in the art, and the electrochemical and thermal stability of the catalysts and the long-term life characteristics of the catalysts after 300 repeated experiments were evaluated.

As a result, when the following conditions were all met, the catalysts were excellent in electrochemical stability, durability, thermal stability, and long-term life characteristics compared to existing noble metal catalysts or non-noble metal catalysts and the amounts of hydrogen or oxygen evolved from the catalysts and the hydrogen or oxygen evolution rates were maintained at high levels for a long time, unlike when other conditions and other numerical ranges were employed.

(1) The substrate is a nickel foam, (2) the tungsten oxide precursor is $WO_3$, (3) the tungsten oxide nanostructures are grown by thermal evaporation for 50 to 70 minutes after heating to 1000 to 1100° C. at a ramp rate of 17 to 18° C./min under a vacuum of 0.06 mbar or less, (4) the tungsten oxide nanostructures have an average length of 45 to 55 μm and a thickness of 1.5 to 2.5 μm, (5) the tungsten oxide nanostructures have an interplanar distance (d-spacing) of 0.31 to 0.42 nm, as measured by X-ray diffraction, (6) the nickel precursor is nickel chloride hexahydrate, (7) the transition metal precursor is $FeCl_3·6H_2O$ or $CoCl_2·6H_2O$, (8) the nickel precursor and the transition metal precursor are mixed in a molar ratio of 2:1 to 4:1, (9) the nickel hydroxide-tungsten oxide intermediate is formed by electrodeposition at −1.1 to −0.9 V for 250 to 350 seconds, (10) the phosphorus precursor is sodium hypophosphite ($NaPO_2H_2·H_2O$), (11) the secondary thermal treatment is performed for phosphorization under an inert atmosphere at 280 to 320° C. for 1.8 to 2.2 hours, (12) the amount of the transition metal doped is 3.31 to 7.22 atomic %, based on 100 atomic % of the coral reef-like nickel phosphide-tungsten oxide nanocomposite, and (13) the amount of metal atoms in the shell is 36 to 40 atomic %, based on 100 atomic % of the coral-like nickel phosphide-tungsten oxide nanocomposite.

When any one of the above conditions was not met, the electrochemical stability and thermal stability of the catalysts deteriorated considerably with the passage of reaction time and the amounts of hydrogen or oxygen evolved and the hydrogen or oxygen evolution rates when the catalysts were used were at levels similar to or lower than those when existing noble metal catalysts or non-noble metal catalysts were used.

The present invention will be more specifically explained with reference to the following examples but is not limited to these examples.

Example 1: Preparation of NiCoP—$WO_x$/NF Nanocomposite $WO_3$, 1.0 M KOH, $NaH_2PO_2·H_2O$, $NiCl_2·6H_2O$, $CoCl_2·6H_2O$, and $FeCl_3·6H_2O$ were provided by Sigma-Aldrich Chemicals. Nickel foam (NF) was purchased from MTI Korea (South Korea). NF was cleaned in a mixed solution of acetone, ethanol, and water for 10 min to remove surface contaminants.

First, $WO_x$/NF nanowires (NWs) were fabricated by thermal evaporation. Six pieces of cleaned NF (1 cm×2 cm) were placed face-down in a porcelain boat filled with $WO_3$ powder (2 g). This boat was placed in a furnace under vacuum conditions and heated to 1050° C. for 1 h at a ramp rate of 17.5° C./min. After cooling to room temperature, $WO_x$/NF NWs were obtained. Next, 0.20 M $NiCl_2·6H_2O$ and 0.10 M $CoCl_2·6H_2O$ were added to $WO_x$/NF NWs, followed by electrodeposition at −1.0 V for 300 sec to fabricate $M_xN_y(OH)_2$—$WO_x$/NF (M=Ni, N=Co, x=2, y=1) as an intermediate.

Then, a porcelain boat with $NaH_2PO_2·H_2O$ (1 g) was placed on the upstream side of a two-zone tube furnace, and another boat with 4 pieces of $M_xN_y(OH)_2$—$WO_x$/NF was placed downstream of the furnace. $NaH_2PO_2·H_2O$ and $M_xN_y(OH)_2$—$WO_x$/NF were heated at 300° C. for 2 h with a heating time of 30 min in a flow of Ar atmosphere to synthesize a NiCoP—$WO_x$/NF nanocomposite.

Example 2: Preparation of NiFeP—$WO_x$/NF Nanocomposite

Phosphorized NiFeP—$WO_x$/NF was synthesized in the same manner as in Example 1, except that 0.24 M $NiCl_2·6H_2O$ and 0.06 M $FeCl_3·6H_2O$ were added to $WO_x$/NF NWs, followed by electrodeposition to prepare $M_xN_y(OH)_2$—$WO_x$/NF (M=Ni, N=Fe, x=4, y=1) as an intermediate.

Comparative Example 1: Preparation of NiCoP/NF Nanocomposite

A NiCoP/NF nanocomposite was prepared in the same manner as in Example 1, except that the preparation of $WO_x$/NF NWs was omitted and NiCoP nanosheets (NSs) were directly grown on the nickel foam.

Comparative Example 2: Preparation of NiFeP/NF Nanocomposite

A NiFeP/NF nanocomposite was prepared in the same manner as in Example 1, except that the preparation of $WO_x$/NF NWs was omitted and NiFeP nanosheets (NSs) were directly grown on the nickel foam.

Comparative Example 3: Preparation of Pt/NF Nanocomposite

A Pt/NF nanocomposite was prepared in the same manner as in Example 1, except that a Pt film was grown on the nickel foam (NF).

Comparative Example 4: Preparation of Ir/NF Nanocomposite

An Ir/NF nanocomposite was prepared in the same manner as in Example 1, except that an Ir film was grown on the nickel foam (NF).

Experimental Example 1-1: XRD and SEM Analyses of the Ni(Co,Fe)P—$WO_x$/NF Nanocomposites The morphologies and crystallinities of the Ni(Co,Fe)P—$WO_x$/NF nanocomposites prepared in Examples 1 and 2 were characterized by scanning electron microscopy (SEM) and X-ray diffraction (XRD). The results are shown in FIGS. 2 to 5.

FIGS. 2A to 2D show low- and high-magnification SEM images of the $WO_x$/NF NW corals (FIG. 2A and FIG. 2C) and the NiCoP—$WO_x$/NF algae (FIG. 2B and FIG. 2D) prepared in Example 1.

Figure 3:
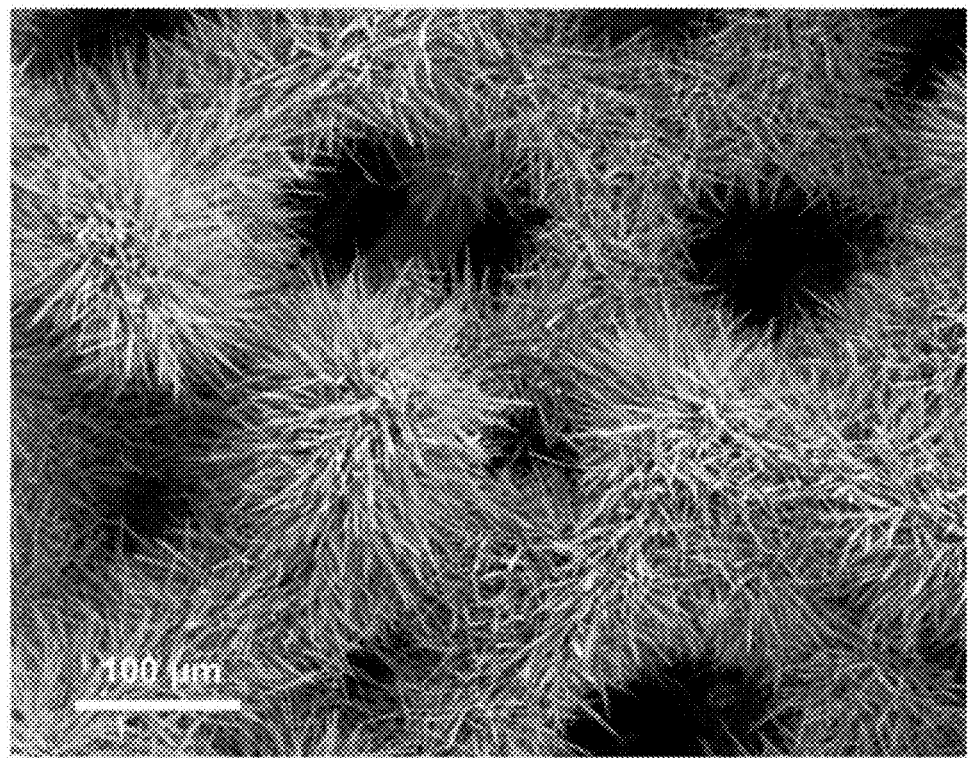
FIG. 3 is a SEM image of $WO_x/NF$ NWs prepared in Example 1.

FIG. 3 is a SEM image of $Wo_x$/NF NWs prepared in Example 1.

Figure 4:
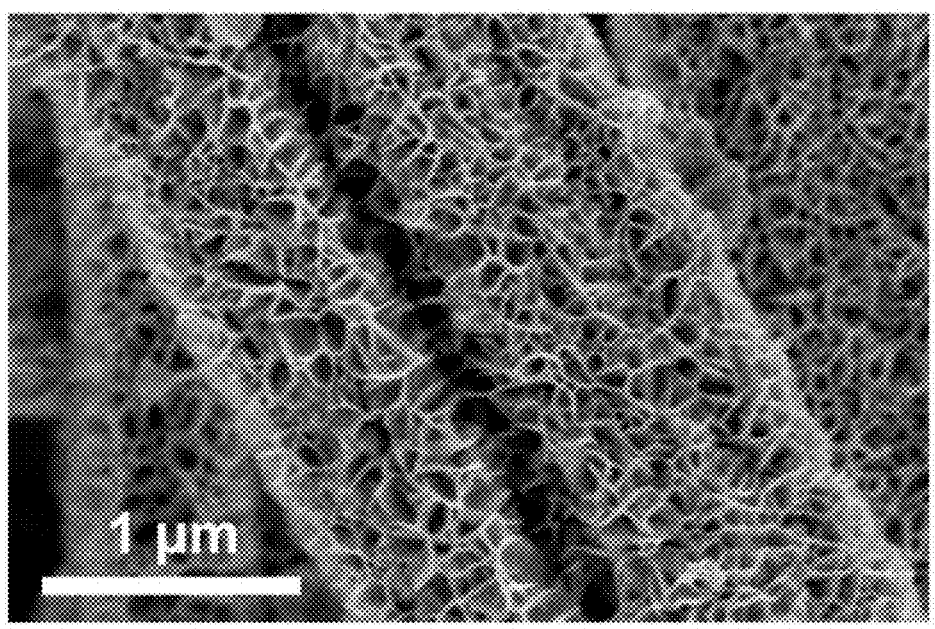
FIG. 4 is a SEM image of a $NiFeP—WO_x/NF$ nanocoral reef catalyst fabricated in Example 2.

FIG. 4 is a SEM image of the NiFeP—$WO_x$/NF nanocoral reef catalyst fabricated in Example 2.

Referring to FIGS. 2 to 4, $WO_x$/NF NWs were grown densely in a vertical direction on the nickel foam by thermal evaporation and were in the form of coral reefs. $WO_x$/NF NWs deposited on the nickel foam had an average length of 50 μm and provided numerous catalytic active sites. Referring to FIG. 2C, $WO_x$ NWs were ~2 μm thick and had a high crystallinity and conductivity, which enhanced the charge transfer of the catalysts. The electrodeposition of NiCoP nanosheet (NS) algae on the $WO_x$ NW coral thickened the nanocomposite as shown in FIG. 2B. The highly magnified image in FIG. 2D shows that 2D NiCoP NSs, which were several nanometers thick, densely covered the $WO_x$ NW corals, which increased the number of active sites. A similar structure was also found for the NiFeP—$WO_x$/NF nanocomposite of FIG. 4.

Figure 5:
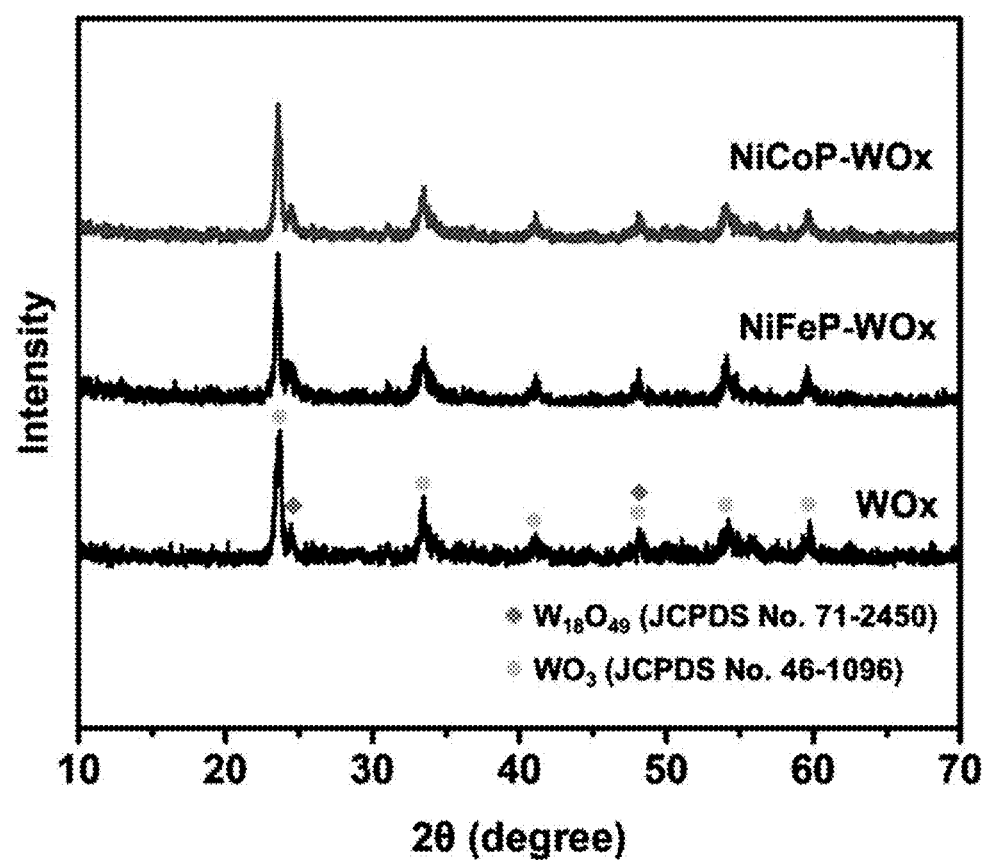
FIG. 5 shows XRD patterns of a $NiCoP—WO_x/NF$ nanocomposite prepared in Example 1, a $NiFeP—WO_x/NF$ nanocomposite prepared in Example 2, and $WO_x/NF$ used to prepare the nanocomposites.

FIG. 5 shows XRD patterns of the NiCoP—$WO_x$/NF nanocomposite prepared in Example 1, the NiFeP—$WO_x$/

NF nanocomposite prepared in Example 2, and WO$_x$/NF used to prepare the nanocomposites. Referring to FIG. 5, WO$_x$ grown on NF was composed of crystalline W$_{18}$O$_{49}$ (JCPDS No. 71-2450) and WO$_3$ (JCPDS No. 46-1096). No additional peaks other than the peaks for WO$_x$ NWs were found in NiCoP—WO$_x$/NF and NiFeP—WO$_x$/NF, suggesting the amorphous features of Ni(Co,Fe)P, as shown in FIG. 5.

Experimental Example 1-2: TEM, EDS, EDX and XPS analyses of the NiCoP—WO$_x$/NF Nanocomposites To reveal the detailed structures and electronic chemical states of the Ni(Co,Fe)P—WO$_x$/NF nanocomposites prepared in Examples 1 and 2, transmission electron microscopy (TEM), EDS elemental mapping, energy dispersive X-ray (EDX) spectroscopy, and X-ray photoelectron spectroscopy (XPS) were conducted. The results are shown in Table 1 and FIGS. 6 and 7.

FIGS. 6A to 6I show TEM characterizations of the NiCoP—WO$_x$/NF nanocomposite prepared in Example 1: Low magnification image (FIG. 6A), enlarged view of NiCoP—WO$_x$/NF (FIG. 6B), HRTEM image of the interface of NiCoP—WO$_x$/NF (FIG. 6C), image of NiCoP—WO$_x$/NF for EDX mapping (FIG. 6D), and elemental mappings of W, O, Ni, Co, and P in NiCoP—WO$_x$/NF (FIGS. 6E to 6I).

Figure 6A:
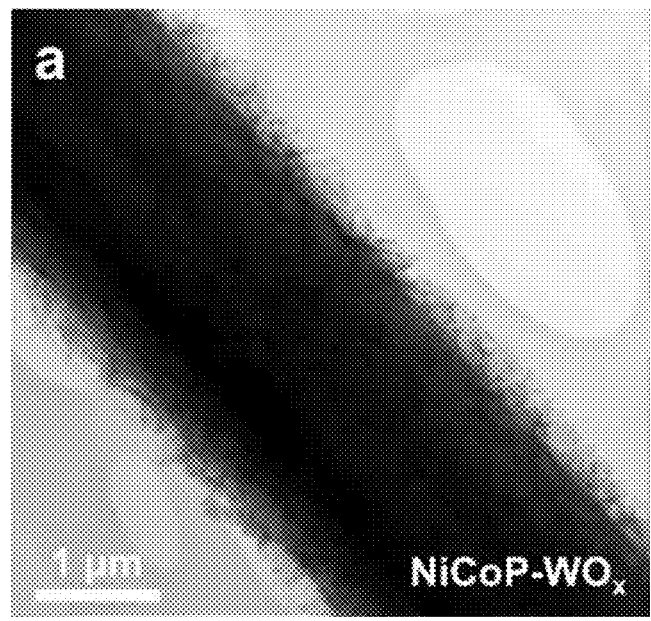
FIGS. 6A to 6I show TEM characterizations of a $NiCoP—WO_x/NF$ nanocomposite prepared in Example 1. Low magnification image (FIG. 6A), enlarged view of $NiCoP—WO_x/NF$ (FIG. 6B), HRTEM image of the interface of $NiCoP—WO_x/NF$ (FIG. 6C), image of $NiCoP—WO_x/NF$ for EDX mapping (FIG. 6D), and elemental mappings of W, O, Ni, Co, and P in $NiCoP—WO_x/NF$ (FIGS. 6E to 6I)
Figure 6B:
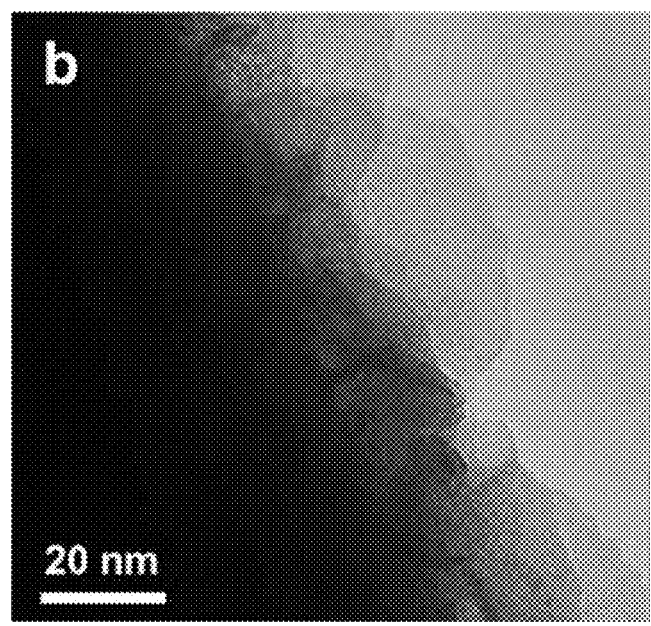
Figure 6C:
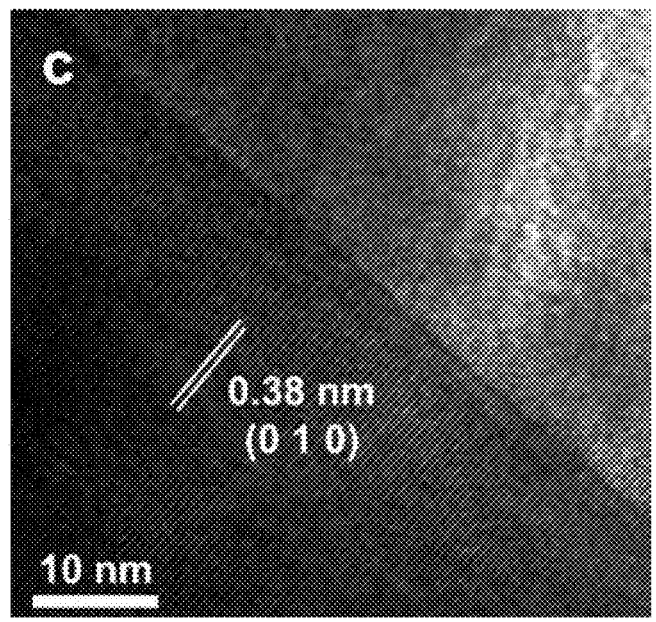
Figure 6D:
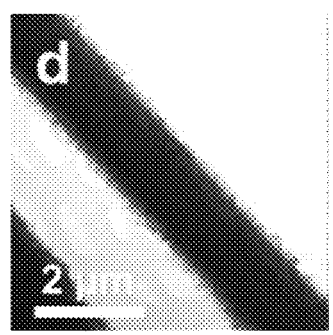
Figure 6E:
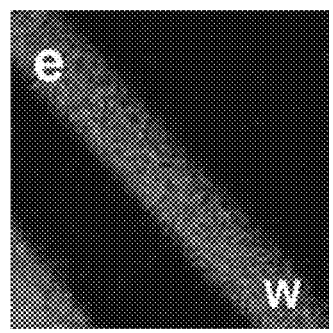
Figure 6F:
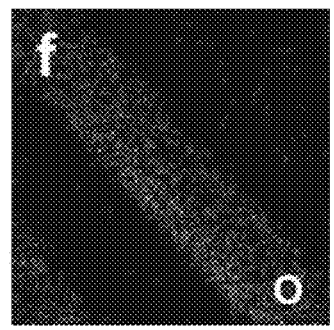
Figure 6G:
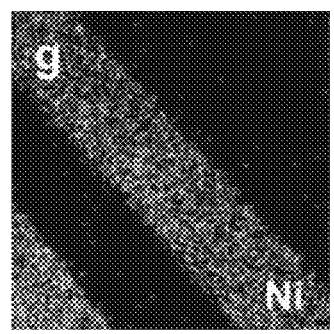
Figure 6H:
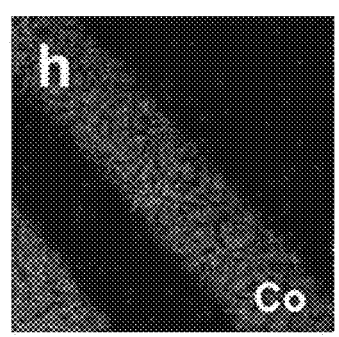
Figure 6I:
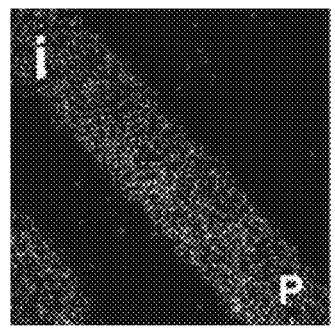

As seen in FIG. 6A, the TEM image confirms a hierarchical structure, where highly dense 2D NiCoP NSs coated the surface of crystalline WO$_x$ NWs. The enlarged view (FIG. 6B) demonstrates the ultrathin features of the NiCoP nanosheets. The HRTEM image of NiCoP—WO$_x$/NF (FIG. 6C) exhibited a lattice fringe with an interplanar distance of 0.38 nm, which correlates with the (010) plane of WO$_x$ NWs. On the other hand, NiCoP NSs showed amorphous features.

The dispersive X-ray (EDX) spectroscopic data are shown in Table 1.

TABLE 1

| Example 1 | | Example 2 | |
|---|---|---|---|
| Element | atomic % | Element | atomic % |
| W | 14.82 | W | 14.61 |
| O | 45.94 | O | 49.36 |
| Ni | 15.13 | Ni | 13.44 |
| Co | 7.22 | Fe | 3.31 |
| P | 16.89 | P | 19.28 |

The results in Table 1 and FIGS. 6E to 6I confirm the existence of W, O, Ni, Co, and P and the uniform distribution of these elements in the NiCoP—WO$_x$/NF nanocomposite of Example 1. The EDS elemental mappings reveal the existence of cobalt (Co) in an amount of 7.22 atomic % in the NiCoP—WO$_x$/NF nanocomposite.

In addition, the results in Table 1 and FIGS. 6E to 6I confirm the existence of W, O, Ni, Fe, and P and the uniform distribution of these elements in the NiFeP—WO$_x$/NF nanocomposite of Example 2, as in the NiCoP—WO$_x$/NF nanocomposite. Particularly, the EDS elemental mappings reveal the existence of iron (Fe) in an amount of 3.31 atomic % in the NiFeP—WO$_x$/NF nanocomposite.

Figure 7A:
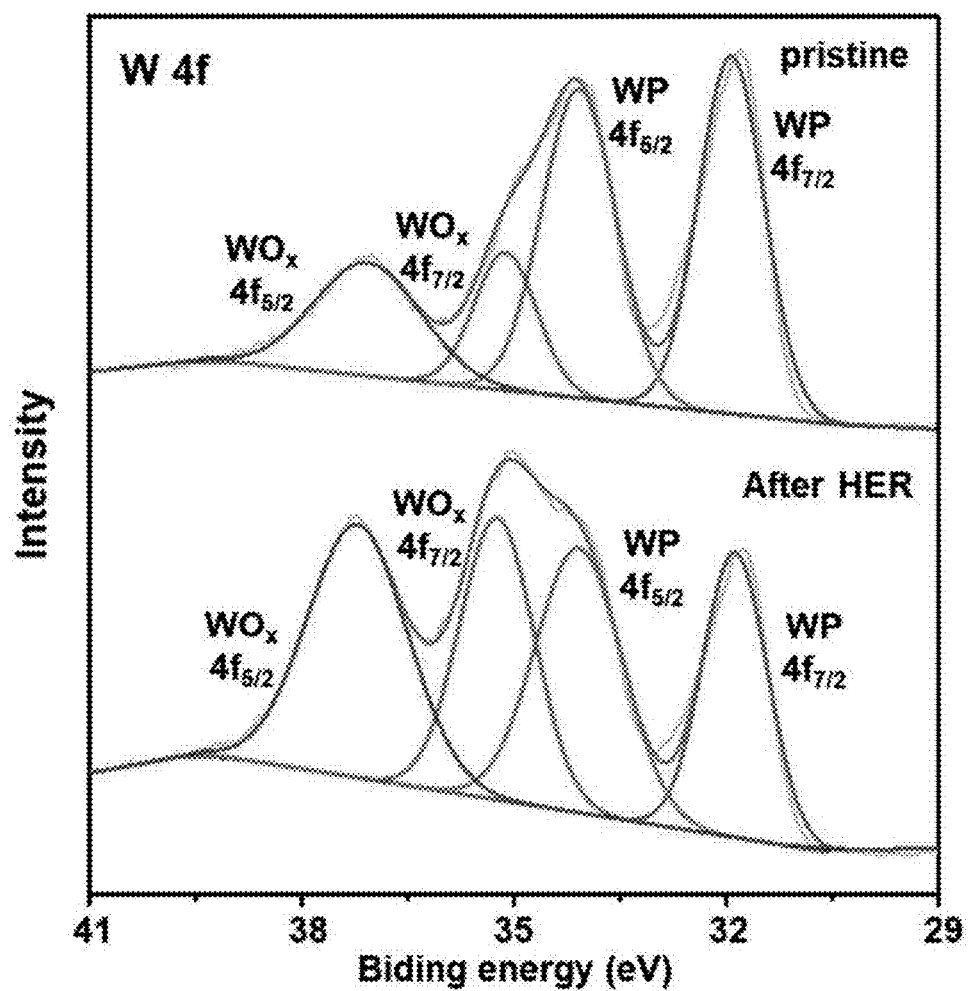
FIGS. 7A to 7D show XPS spectra of a $NiCoP—WO_x/NF$ nanocomposite prepared in Example 1.
Figure 7B:
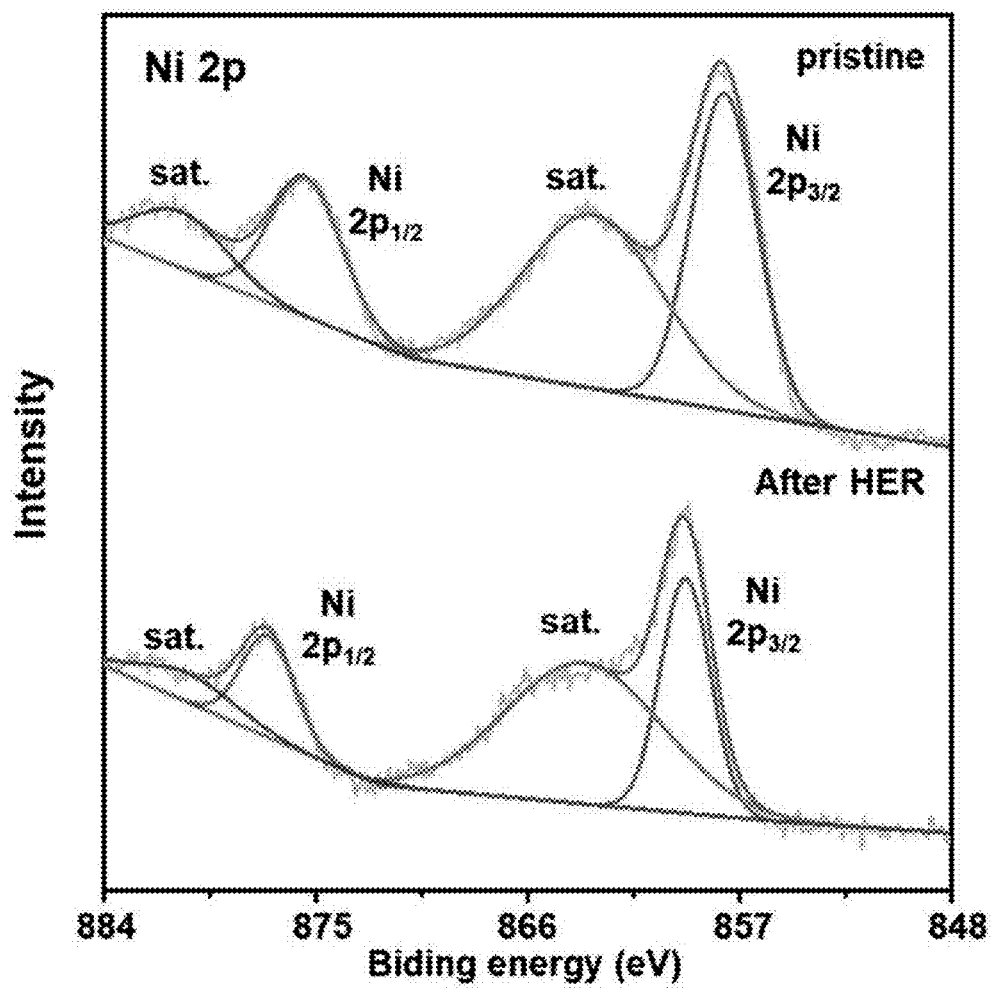
Figure 7C:
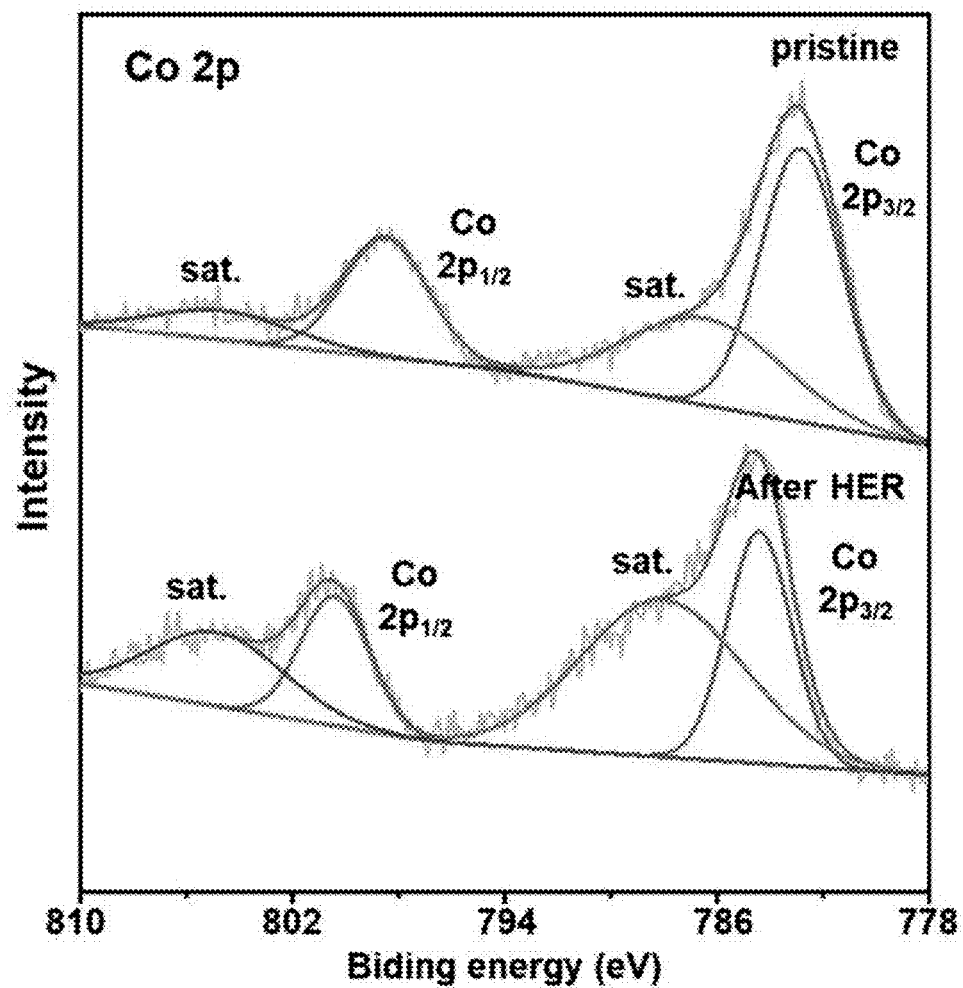

FIGS. 7A to 7D show XPS spectra of the NiCoP—WO$_x$/NF nanocomposite prepared in Example 1. FIG. 7A exhibits the W 4f XPS spectra of the NiCoP—WO$_x$/NF nanocomposite before and after the HER. The peaks at 31.9 and 34.1 eV correspond to W 4f$_{7/2}$ and W 4f$_{5/2}$ in the W—P bonds, respectively. In addition, the peaks at 35.2 and 37.2 eV confirm the existence of W—O bonds. After the HER reaction, the intensities of peaks related to the W—P bonds decreased, while those of the W—O bonds increased. This result originates from the surface oxidation of catalysts during the HER in KOH solution.

In the Ni 2p spectra (FIG. 7B), two peaks were observed at 857.7 and 875.4 eV, which are associated with Ni 2p$_{3/2}$ and Ni 2p$_{1/2}$ in Ni$^{2+}$, respectively. The peaks at 863.2 and 880.7 eV are satellite peaks of Ni 2p. In the Co 2p spectra (FIG. 7C), the binding energies of 782.8 and 794.5 eV are assigned to Co 2p$_{3/2}$ and Co 2p$_{1/2}$ in Co$^{2+}$, respectively. The other two peaks at 786.4 and 804.7 eV originate from the satellite peaks of Co 2p. After the HER reaction, the peaks of the Ni and Co 2p regions both shifted to higher binding energies, suggesting that the alkaline HER oxidized the Ni and Co species.

Figure 7D:
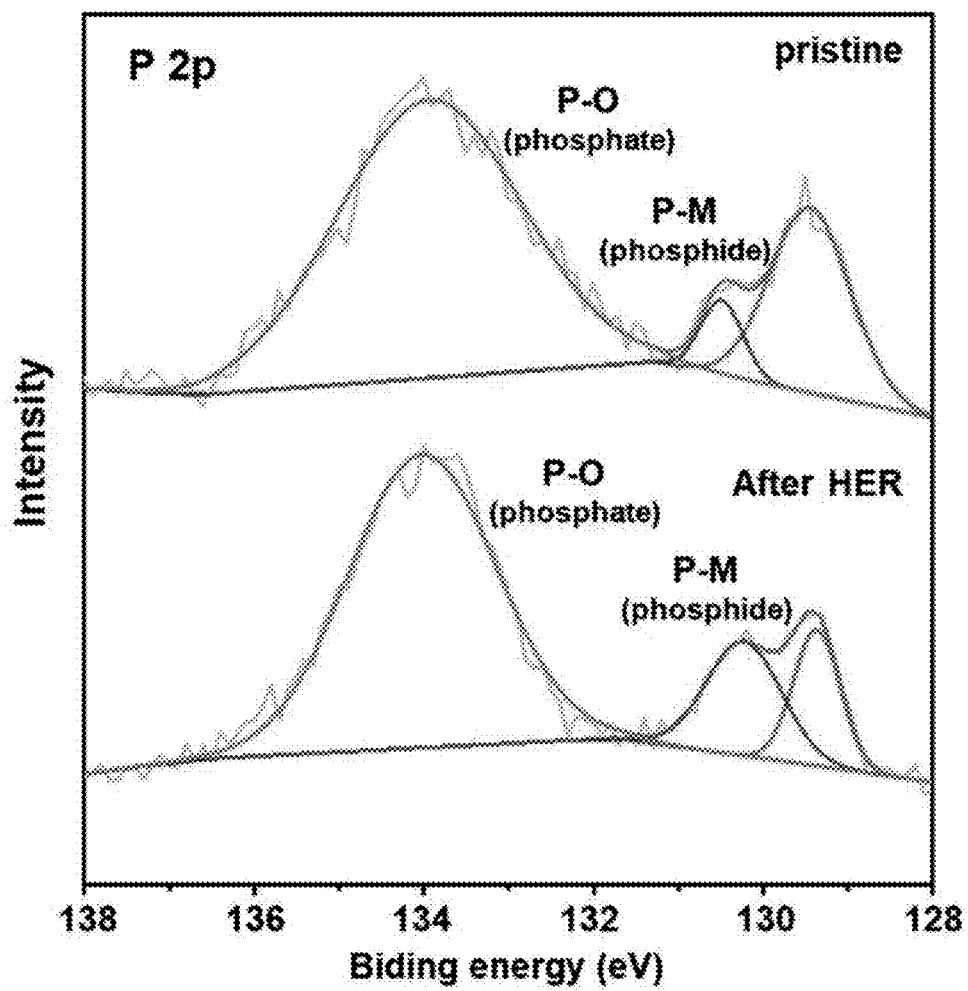

In the P 2p spectra shown in FIG. 7D, the peaks at 129.4 and 130.5 eV confirm the metal-phosphide binding states, and the additional broad peak at 133.9 eV reflects the existence of phosphides. The intensities of the peaks related to phosphides were retained after the HER reaction, which explains the preservation of surface phosphides.

Experimental Example 1-3: Analysis of Hydrogen Evolution Reaction Performances of the Ni(Co,Fe)P—WO$_x$/NF Nanocomposites The hydrogen evolution reaction performances of the nanocomposites prepared in Examples 1 and 2 and Comparative Examples 1 to 3 were investigated in 1.0 M KOH with a three-electrode system.

In the three-electrode system, the saturated calomel electrode (SCE) was the reference electrode, the prepared electrode was the working electrode, and Pt wire was the counter electrode. The results are shown in FIGS. 8A to 8F.

Figure 8A:
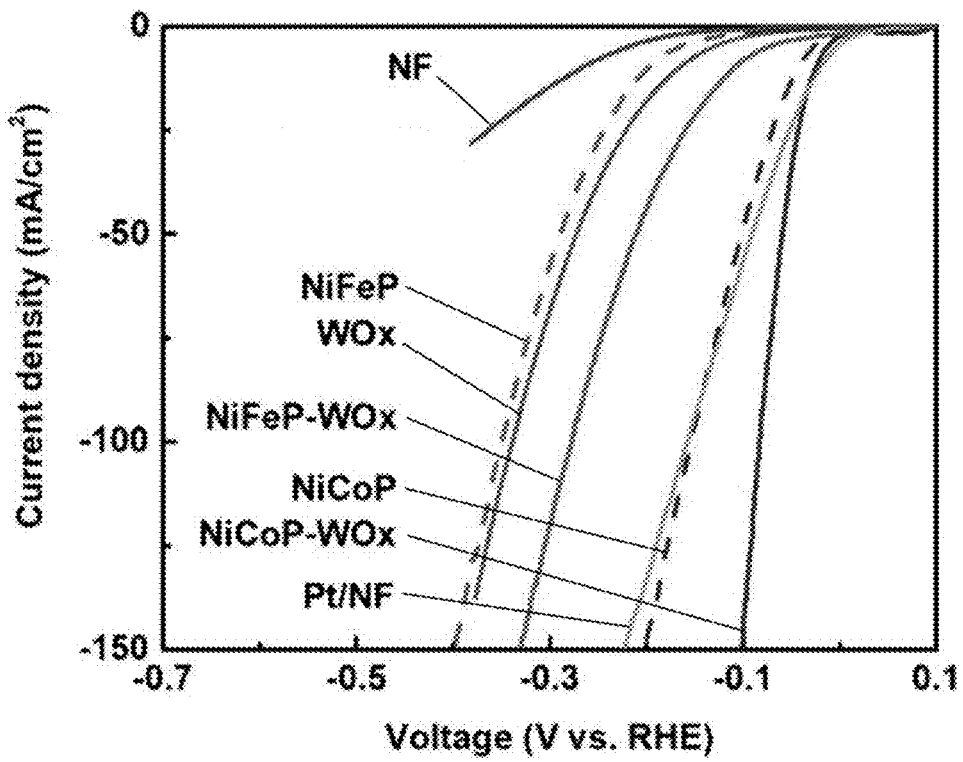
FIGS. 8A to 8F show the hydrogen evolution reaction performances of nanocomposites prepared in Examples 1 and 2 and Comparative Examples 1 to 3. LSV curves of $NiCoP—WO_x/NF$, NiCoP/NF, $NiFeP—WO_x/NF$, NiFeP/NF, $WO_x/NF$, NF, and Pt/NF (FIG. 8A), overpotentials of $NiCoP—WO_x/NF$, Pt/NF, and $WO_x/NF$ at 10 and 100 mA/cm² (FIG. 8B), Tafel plots of $NiCoP—WO_x/NF$, NiCoP/NF, $NiFeP—WO_x/NF$, NiFeP/NF, $WO_x/NF$, and Pt/NF (FIG. 8C), time-dependent overpotential curve of $NiCoP—WO_x/NF$ at a current density of 10 mAcm² for 60 h and LSV curves of $NiCoP—WO_x/NF$ before and after 5000 cycles (FIG. 8D), calculated electrochemical surface areas (ECSAs) for $NiCoP—WO_x/NF$ and NiCoP/NF (FIG. 8E), and complex-plane impedance plots of $NiCoP—WO_x/NF$, NiCoP/NF, and $WO_x/NF$ (FIG. 8F)
Figure 8B:
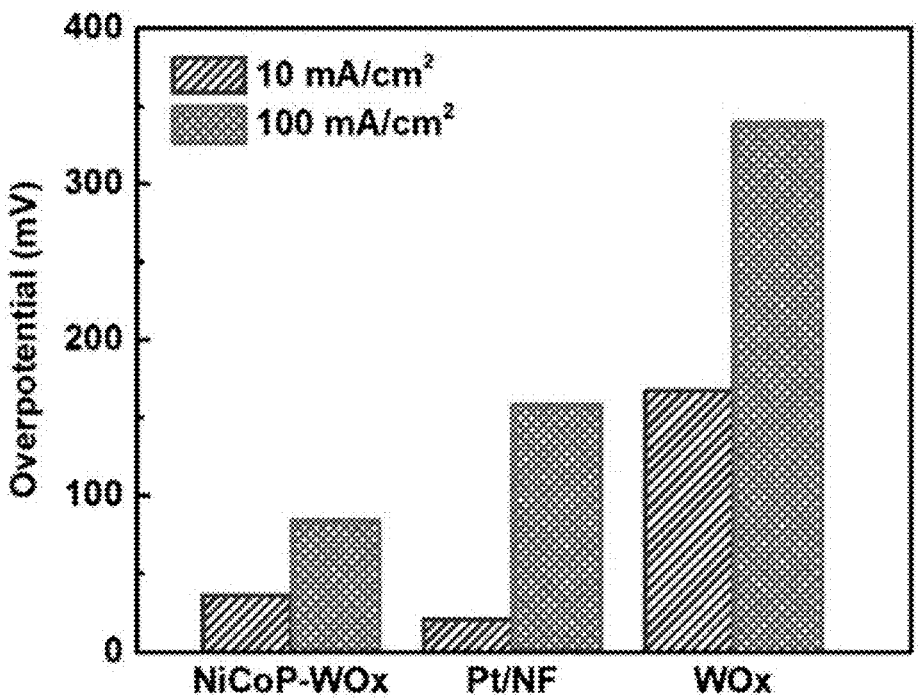
Figure 8C:
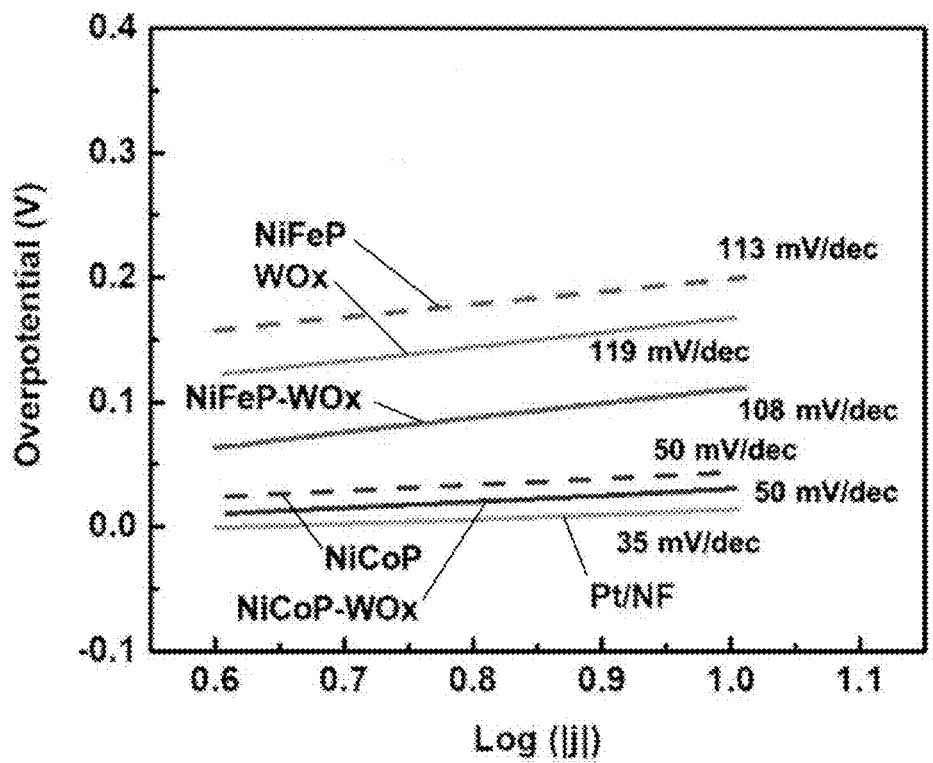
Figure 8D:
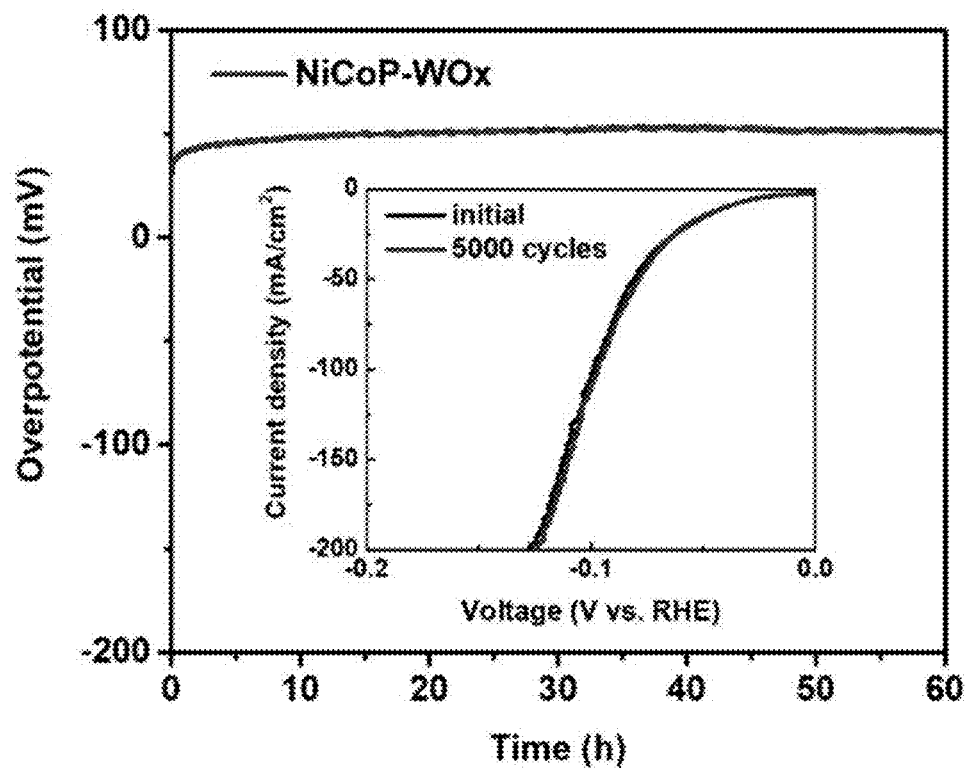
Figure 8E:
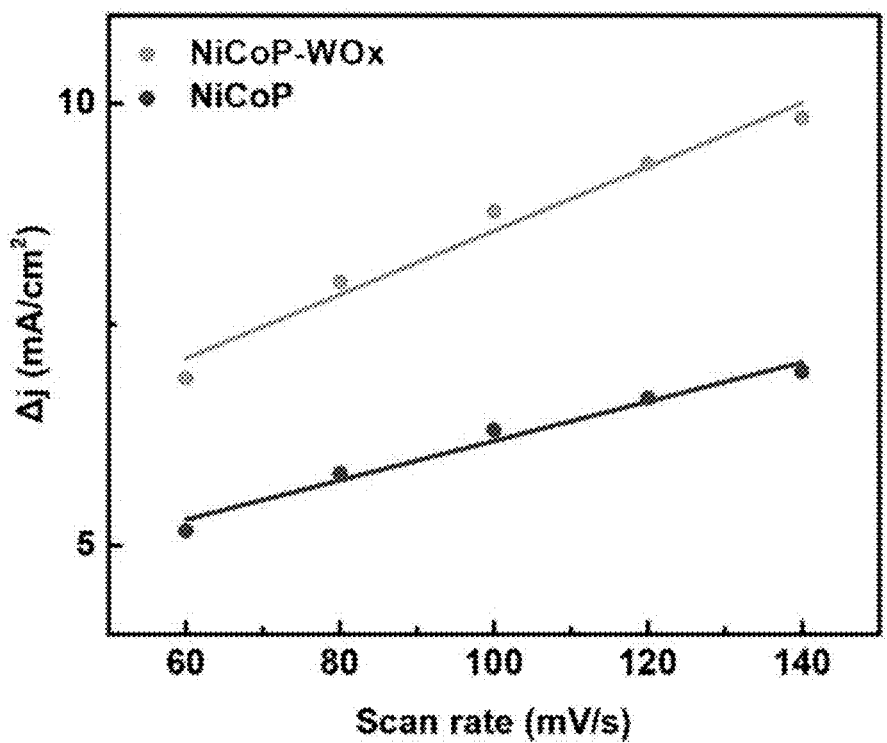
Figure 8F:
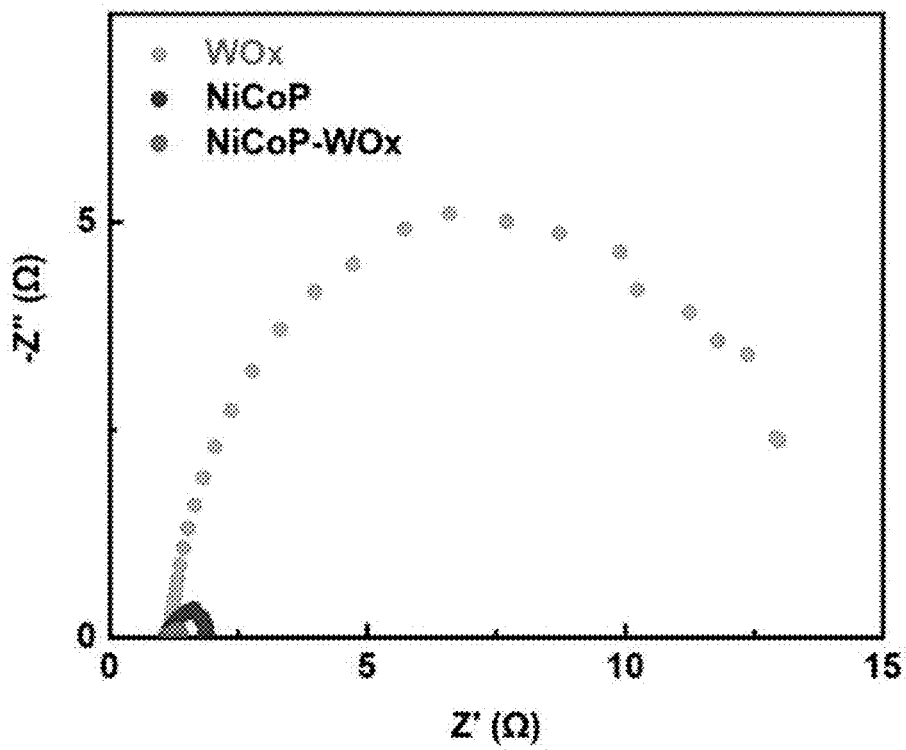

FIGS. 8A to 8F show the hydrogen evolution reaction performances of the nanocomposites prepared in Examples 1 and 2 and Comparative Examples 1 to 3: LSV curves of NiCoP—WO$_x$/NF, NiCoP/NF, NiFeP—WO$_x$/NF, NiFeP/NF, WO$_x$/NF, NF, and Pt/NF (FIG. 8A), overpotentials of NiCoP—WO$_x$/NF, Pt/NF, and WO$_x$/NF at 10 and 100 mA/cm$^2$ (FIG. 8B), Tafel plots of NiCoP—WO$_x$/NF, NiCoP/NF, NiFeP—WO$_x$/NF, NiFeP/NF, WO$_x$/NF, and Pt/NF (FIG. 8C), time-dependent overpotential curve of NiCoP—WO$_x$/NF at a current density of 10 mAcm$^2$ for 60 h and LSV curves of NiCoP—WO$_x$/NF before and after 5000 cycles (FIG. 8D), calculated electrochemical surface areas (ECSAs) for NiCoP—WO$_x$/NF and NiCoP/NF (FIG. 8E), and complex-plane impedance plots of NiCoP—WO$_x$/NF, NiCoP/NF, and WO$_x$/NF (FIG. 8F).

Referring to FIG. 8A, Pt/NF, NF, WO$_x$, and NiCoP exhibited overpotentials of 21, 268, 167, and 58 mV, respectively, to generate a current density of 10 mA/cm$^2$. NiCoP/NF, showing a low overpotential of 58 mV, was prepared by the direct deposition of NiCoP nanosheets on nickel foam. The NiCoP—WO$_x$/NF nanocoral reef exhibited a low overpotential of 49 mV, which was superior to the single components, WO$_x$/NF and NiCoP/NF. This prominently enhanced HER activity was caused by the increased conductivity and abundance of active sites derived from the unique hierarchical structures of the biomimetic nanocoral reefs. The overpotential of NiCoP—WO$_x$/NF was much lower than that of NiFeP—WO$_x$/NF (111 mV), which resulted from the favorable intrinsic HER activity of NiCoP/NF compared to that of NiFeP/NF.

Although the NiCoP—WO$_x$/NF nanocomposite showed a higher overpotential than Pt/NF for generating a current density of 10 mA/cm$^2$, at a higher current density of 100 mA/cm$^2$, NiCoP—WO$_x$/NF exhibited higher activity than Pt/NF (FIG. 8B). This superior HER activity at a higher current density may originate from the mass transfer capacity of the nanostructured nanocoral reef, which is beneficial for commercializing the catalyst.

The Tafel slope of NiCoP—WO$_x$/NF showed a small value of 50 mV/dec, which was much lower than that of WO$_x$ (119 mV/dec), NiFeP (113 mV/dec), and NiFeP—WO$_x$/NF (108 mV/dec) (FIG. 8C). The low Tafel slopes of the NiCoP/NF-containing catalysts suggest that NiCoP/NF exhibits favorable HER kinetics, confirming that the NiCoP nanosheet surface exposed in the nanocoral reef structure is very efficient for the HER. The long-term stability of the HER catalyst using the NiCoP—WO$_x$/NF nanocomposite was tested by evaluating the overpotential curve at a fixed current density of 10 mA/cm$^2$ for 60 h. FIG. 8D shows that the overpotential increased by only 5% after 60 h.

FIGS. 8E and 8F show electrochemical surface area (ECSA) and electrochemical impedance spectroscopy (EIS) measurements taken to investigate the mechanisms of the enhanced HER activity in the nanocoral reef structure. In FIG. 8E, the ECSA of NiCoP—WO$_x$/NF was 1.63 times higher than that of the NiCoP, confirming that NiCoP—WO$_x$/NF had more active sites than the NiCoP due to its nanocoral reef structure.

EIS was conducted to investigate the charge transfer resistance of the catalysts by measuring the complex-plane impedance plots of NiCoP—WO$_x$/NF, NiCoP, and WO$_x$. The results are shown in FIG. 8F. The Nyquist plots exhibited semicircles, whose diameter related to the value of charge transfer resistance ($R_{ct}$). The $R_{ct}$ of NiCoP—WO$_x$/NF (1.3Ω) was smaller than that of NiCoP (1.9Ω) and WO$_x$ (14.8Ω). This result indicates that the NiCoP—WO$_x$/NF nanocomposite exhibited a rapid charge transfer compared to each component, NiCoP and WO$_x$, in the HER, confirming its increased conductivity.

Experimental Example 2-1: TEM, EDS, EDX and XPS Analyses of the NiFeP—WO$_x$/NF Nanocomposite To reveal the detailed structure and electronic chemical state of the NiFeP—WO$_x$/NF nanocomposite prepared in Example 2, transmission electron microscopy (TEM), EDS elemental mapping, energy dispersive X-ray (EDX) spectroscopy, and X-ray photoelectron spectroscopy (XPS) were conducted. The results are shown in FIGS. 9 and 10.

FIGS. 9A to 9I show TEM characterizations of the NiFeP—WO$_x$/NF nanocomposite prepared in Example 2: Low magnification image (FIG. 9A), enlarged view of NiFeP—WO$_x$/NF (FIG. 9B), HRTEM image of the interface of NiFeP—WO$_x$/NF (FIG. 9C), image of NiFeP—WO$_x$/NF for EDX mapping (FIG. 9D), and elemental mappings of W, O, Ni, Fe, and P in NiFeP—WO$_x$/NF (FIGS. 9E to 9I).

Figure 9A:
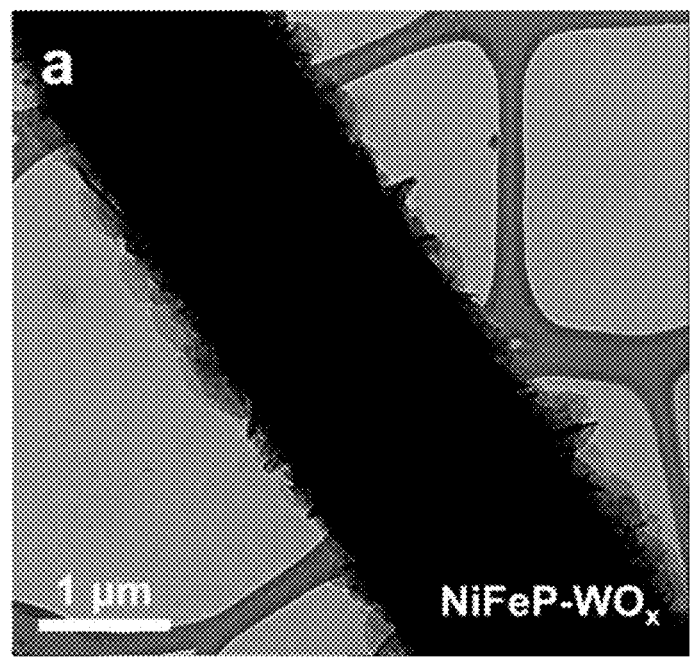
FIGS. 9A to 9I shows TEM characterizations of a $NiFeP—WO_x/NF$ nanocomposite prepared in Example 2. Low magnification image (FIG. 9A), enlarged view of $NiFeP—WO_x/NF$ (FIG. 9B), HRTEM image of the interface of $NiFeP—WO_x/NF$ (FIG. 9C), image of $NiFeP—WO_x/NF$ for EDX mapping (FIG. 9D), and elemental mappings of W, O, Ni, Fe, and P in $NiFeP—WO_x/NF$ (FIGS. 9E to 9I)
Figure 9B:
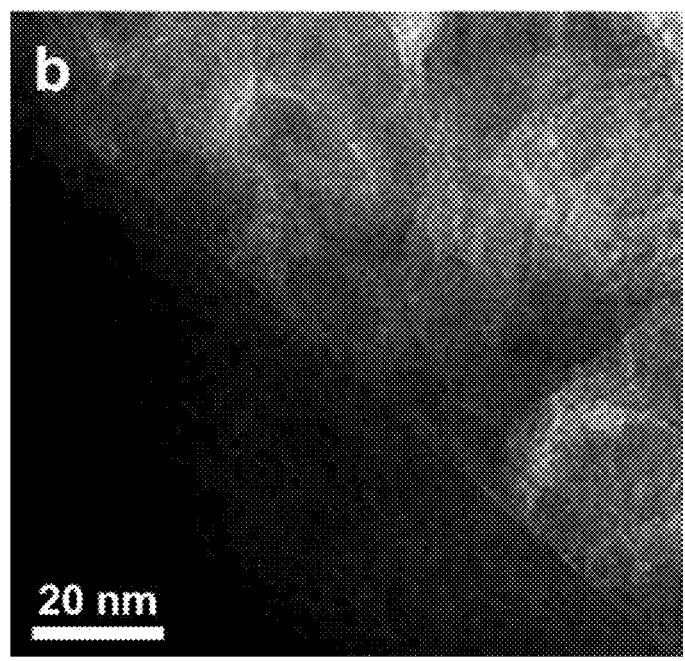
Figure 9C:
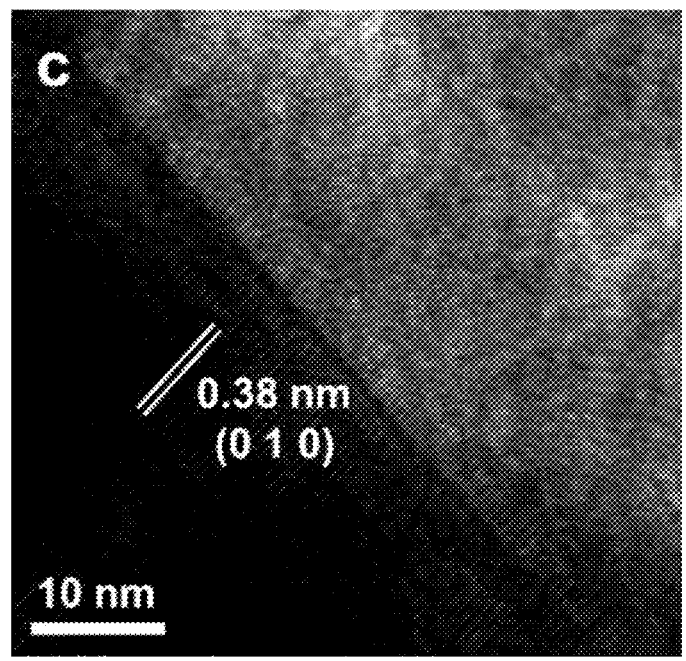
Figure 9D:
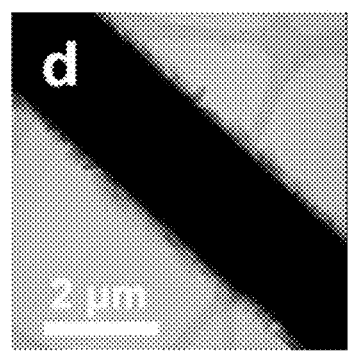
Figure 9E:
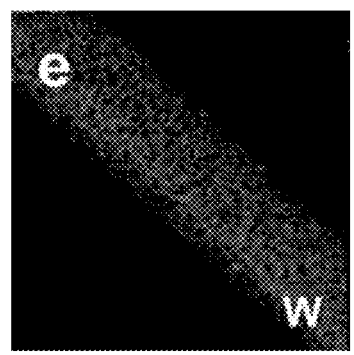
Figure 9F:
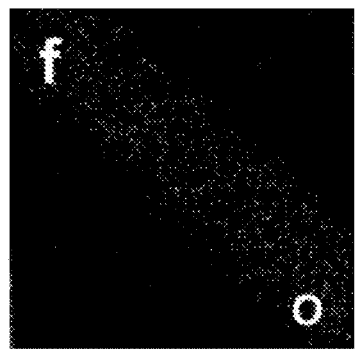
Figure 9G:
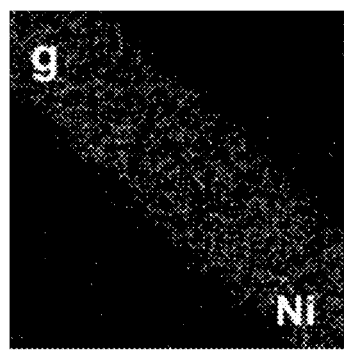
Figure 9H:
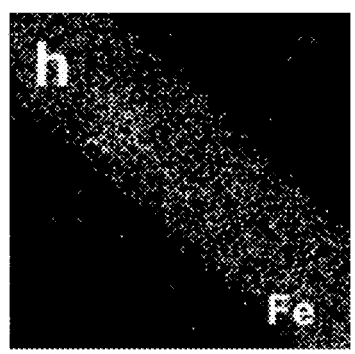
Figure 9I:
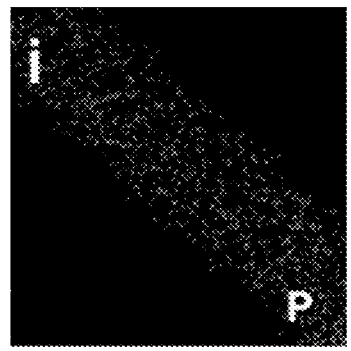
Figure 10A:
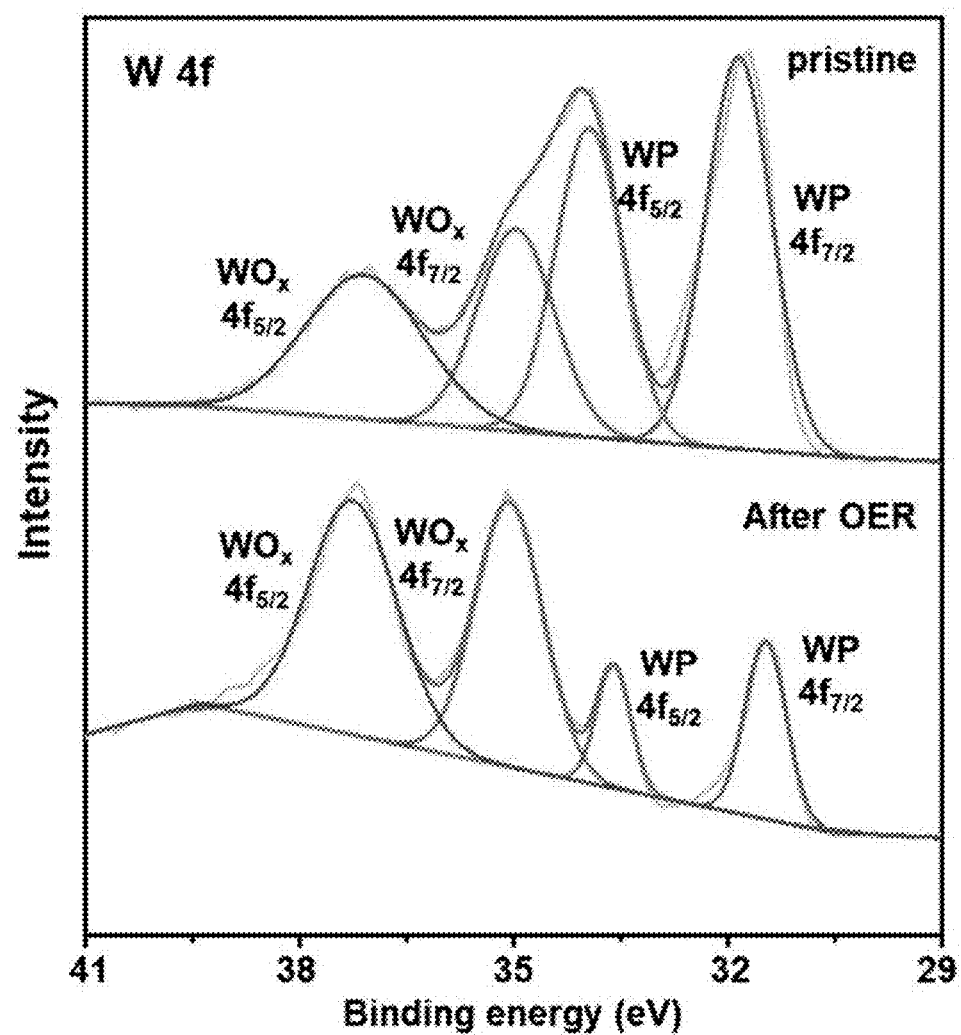
FIGS. 10A to 10D show XPS spectra of a $NiFeP—WO_x/NF$ nanocomposite prepared in Example 2.
Figure 10B:
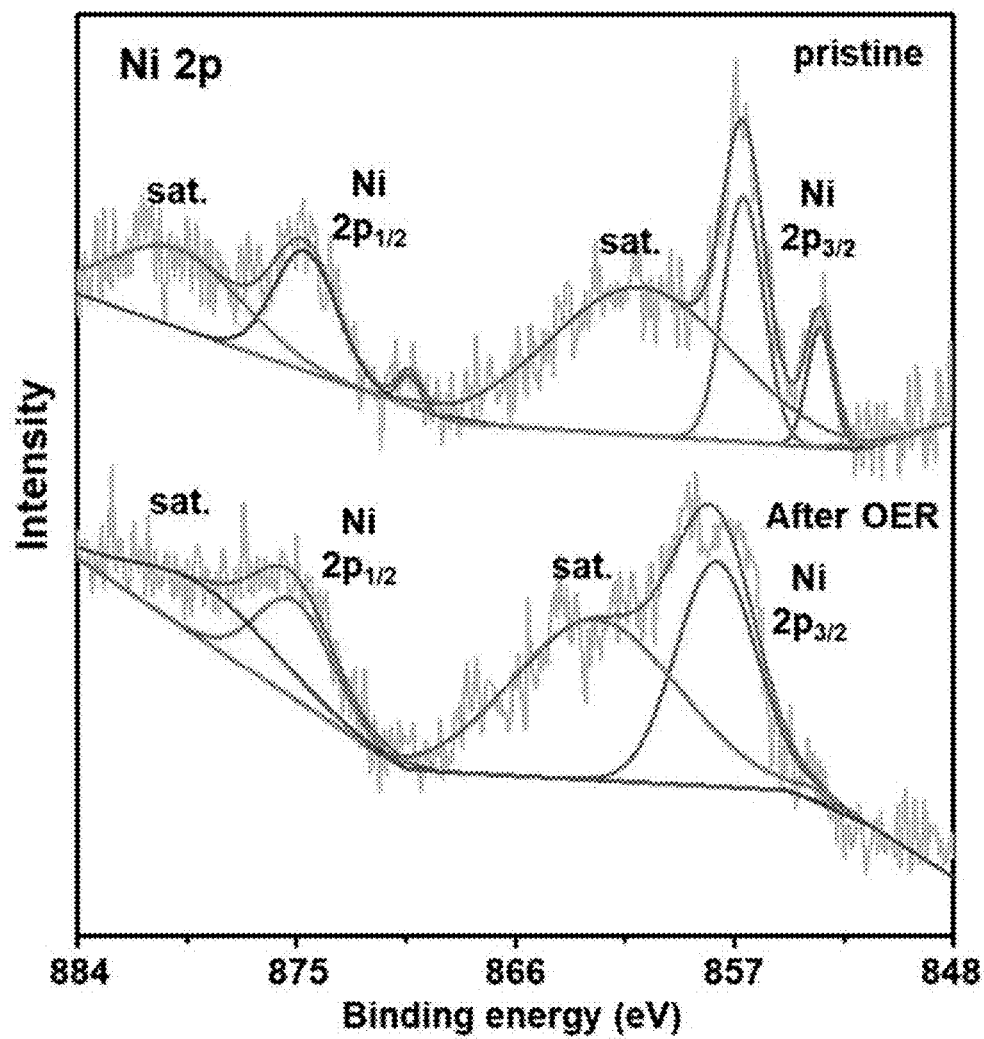
Figure 10C:
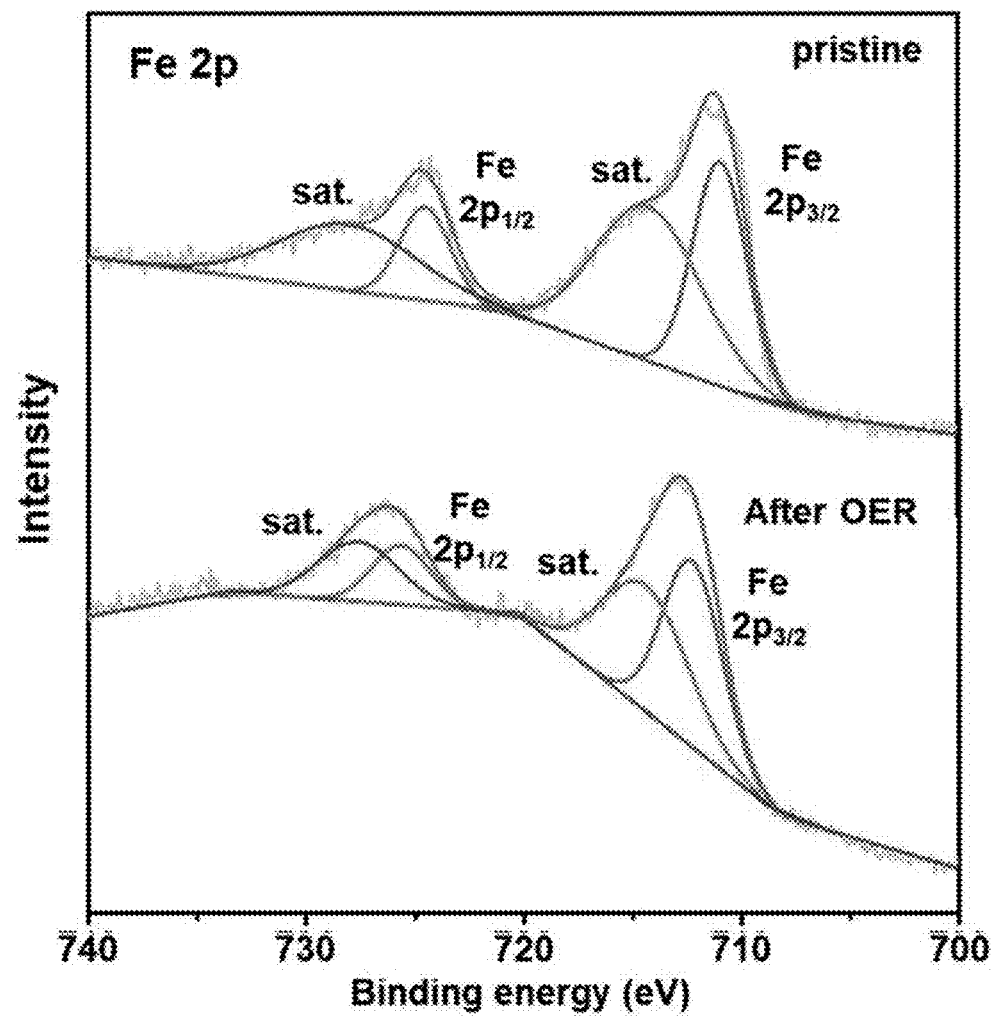
Figure 10D:
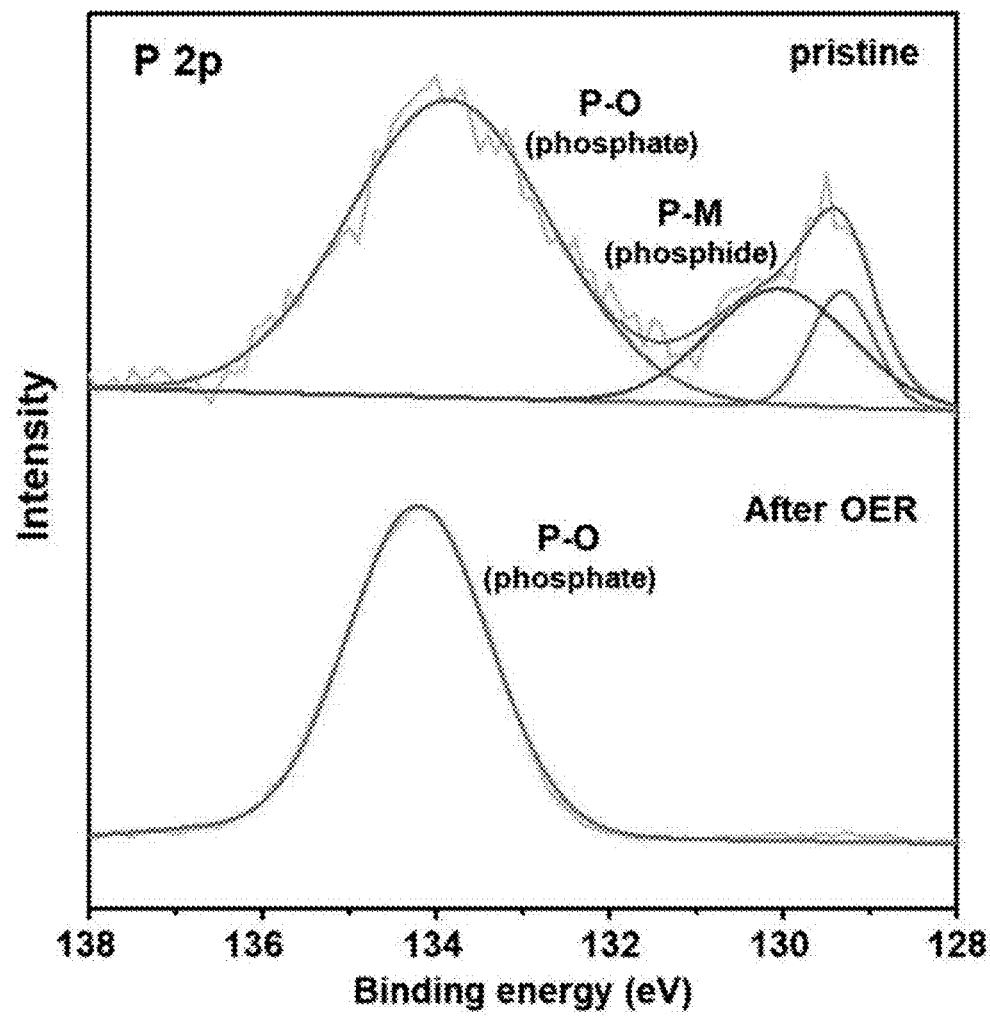

Referring to FIGS. 9A and 9B, high-density, ultrathin NiFeP NSs were coated on the surface of the core WO$_x$ NWs. The HRTEM image of NiFeP—WO$_x$/NF (FIG. 9C) shows a lattice fringe with an interplanar distance of 0.38 nm, which is correlated with the (010) plane of WO$_x$. The NiFeP NS algae exhibited amorphous features. The elemental mapping images in FIGS. 9D to 9I show uniform distributions of W, O, Ni, Fe, and P in the NiFeP—WO$_x$/NF nanocomposite.

FIGS. 10A to 10D show XPS spectra of the NiFeP—WO$_x$/NF nanocomposite prepared in Example 2. In the W 4f XPS spectra of NiFeP—WO$_x$/NF (FIG. 10A), the peaks at 31.8 and 33.9 eV are assigned to W 4f$_{7/2}$ and W 4f$_{5/2}$ in the W—P bonds, respectively. Additional peaks at 35.0 and 37.1 eV are correlated with W—O bonds. After the OER reaction, the W—P bonds noticeably decreased, while the W—O bonds increased. These results suggest that the surfaces of the tungsten phosphides converted to tungsten oxides by the highly oxidative OER process.

In the Ni 2p spectrum of NiFeP—WO$_x$/NF (FIG. 10B), the peaks at 853.5 and 870.4 eV correspond to Ni-metal states, and the other two peaks at 856.6 and 874.6 eV are associated with Ni 2p$_{3/2}$ and Ni 2p$_{1/2}$ in Ni$^{2+}$. Additional peaks at 860.8 and 879.9 eV are satellite peaks of Ni 2p. After the OER reaction, metallic Ni peaks disappeared, which was due to the occurrence of surface oxidation during the OER reaction.

In the Fe 2p spectrum of the NiFeP—WO$_x$/NF (FIG. 10C), the binding energies of 711.0 and 724.5 eV are assigned to Fe 2p$_{3/2}$ and Fe 2p$_{1/2}$ in Fe$^{2+}$, respectively. The other two peaks at 714.3 and 728.1 eV originate from the satellite peaks of Fe 2p. After the OER reaction, the peaks of the Ni and Fe 2p regions shifted to higher binding energies, suggesting the powerful oxidation of Ni and Co species.

In the P 2p spectrum of the NiFeP—WO$_x$/NF (FIG. 10D), the peaks at 129.3 and 130.1 eV confirm phosphide formation, and the broad peak at 133.9 eV confirms the existence of phosphides. The peaks related to phosphides were removed after the OER reaction, indicating the complete conversion of phosphides into phosphates after the OER.

Experimental Example 2-2: Analysis of Oxygen Evolution Reaction Performances of the Ni(Co,Fe) P—WO$_x$/NF Nanocomposites The oxygen evolution reaction performances of the nanocomposites prepared in Examples 1 and 2 and Comparative Examples 1, 2, and 4 were investigated in 1.0 M KOH with a three-electrode system. In the three-electrode system, the saturated calomel electrode (SCE) was the reference electrode, the prepared electrode was the working electrode, and Pt wire was the counter electrode. The results are shown in FIGS. 11A to 11F.

Figure 11A:
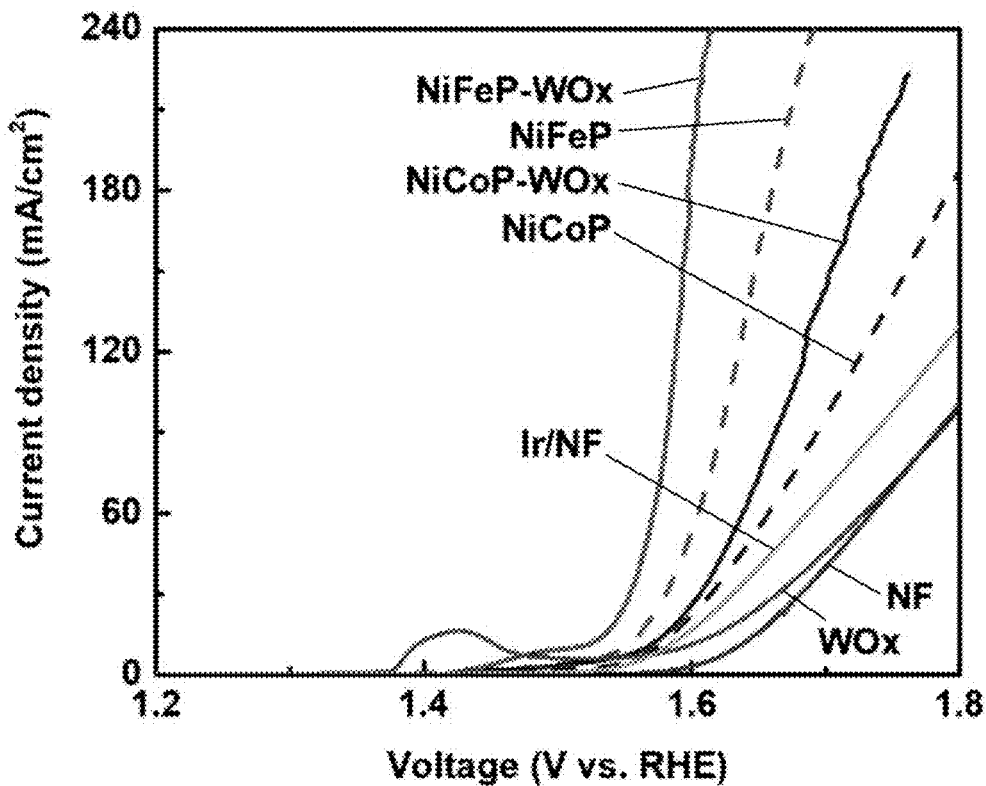
FIGS. 11A to 11F show the oxygen evolution reaction performances of nanocomposites prepared in Examples 1 and 2 and Comparative Examples 1, 2, and 4. LSV curves of $NiFeP—WO_x/NF$, NiFeP/NF, $NiCoP—WO_x/NF$, NiCoP/NF, $WO_x/NF$, NF, and Ir/NF (FIG. 11A), overpotentials of $NiFeP—WO_x/NF$, Ir/NF, and $WO_x/NF$ at 10 and 100 mA/cm² (FIG. 11B), Tafel plots of $NiFeP—WO_x/NF$, NiFeP/NF, $NiCoP—WO_x/NF$, NiCoP/NF, $WO_x/NF$, and Ir/NF (FIG. 11C), time-dependent overpotential curve of $NiFeP—WO_x/NF$ at a current density of 10 mAcm² for 60 h and LSV curves of $NiFeP—WO_x/NF$ before and after 5000 cycles (FIG. 11D), calculated electrochemical surface areas (ECSAs) for $NiFeP—WO_x/NF$ and NiFeP/NF (FIG. 11E), and complex-plane impedance plots of $NiFeP—WO_x/NF$, NiFeP/NF, and $WO_x/NF$ (FIG. 11F)
Figure 11B:
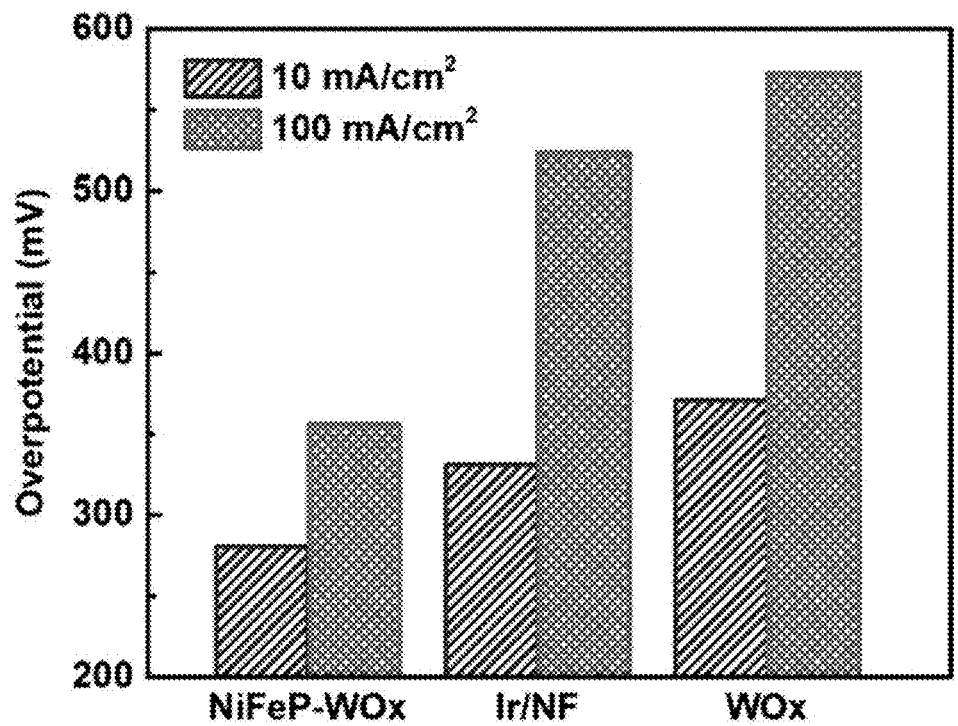
Figure 11C:
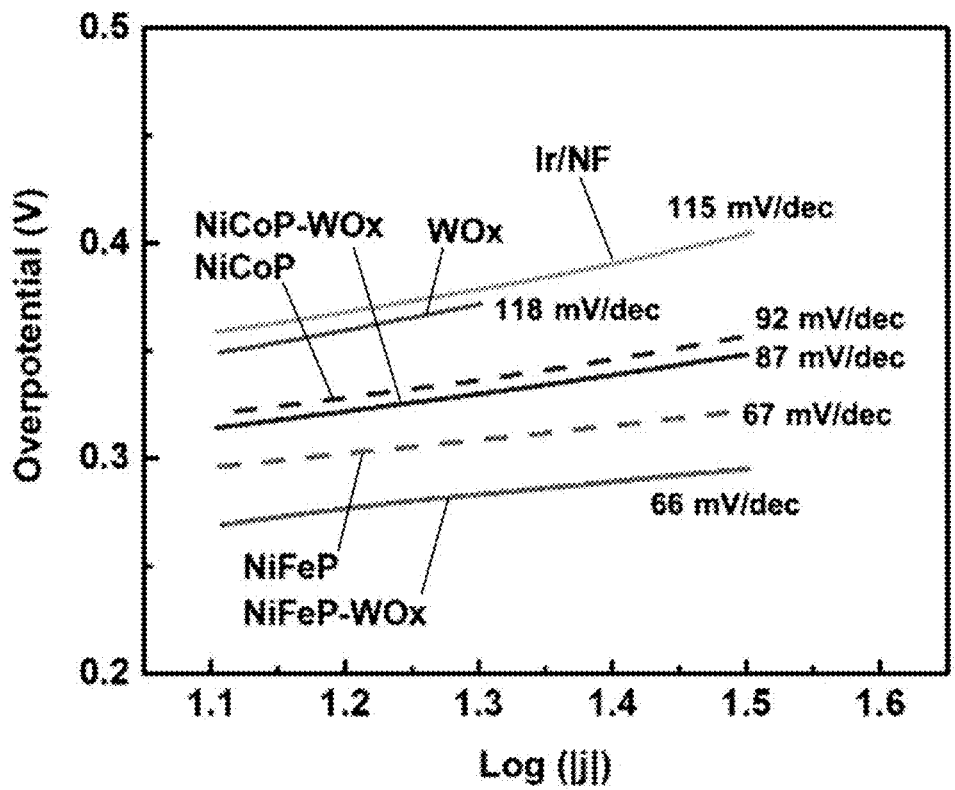
Figure 11D:
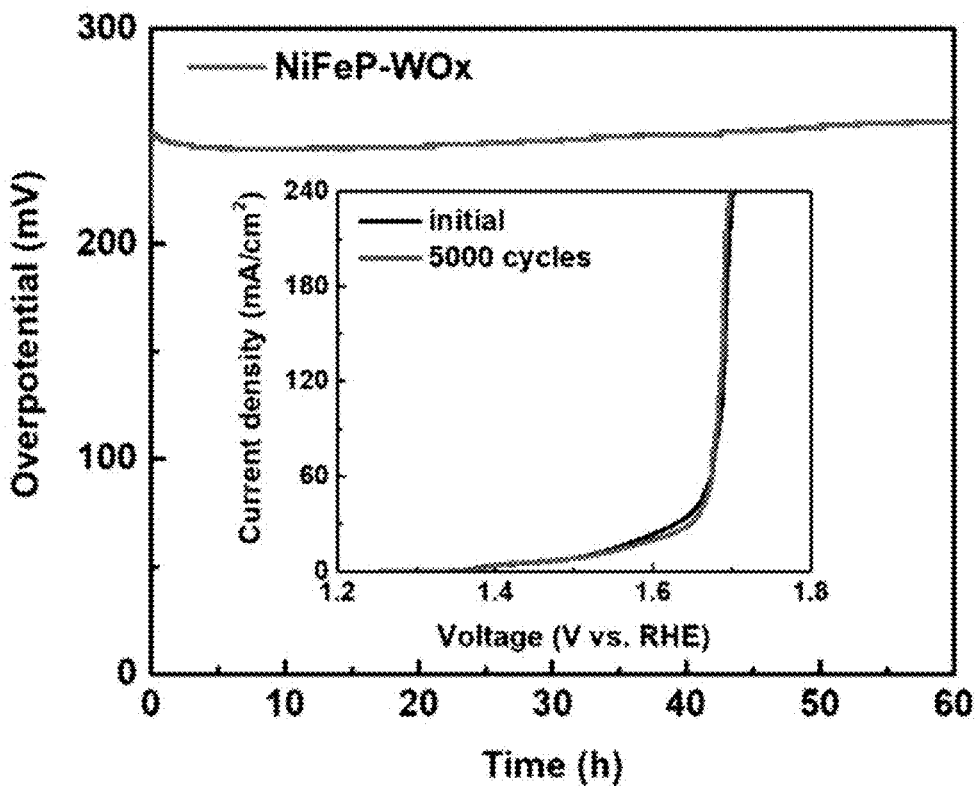
Figure 11E:
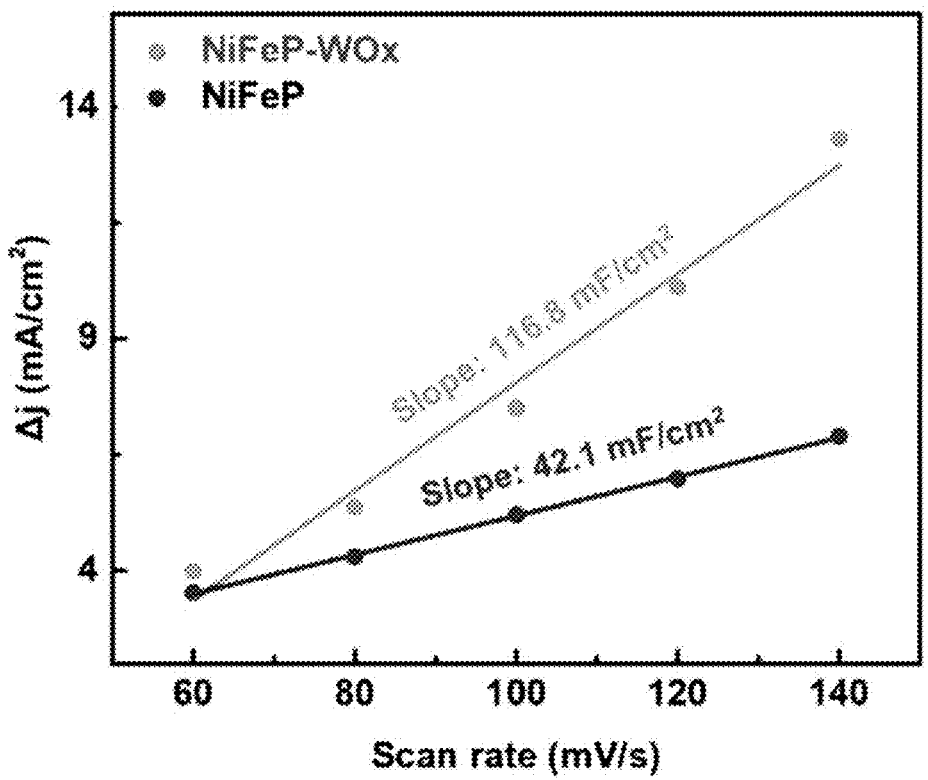
Figure 11F:
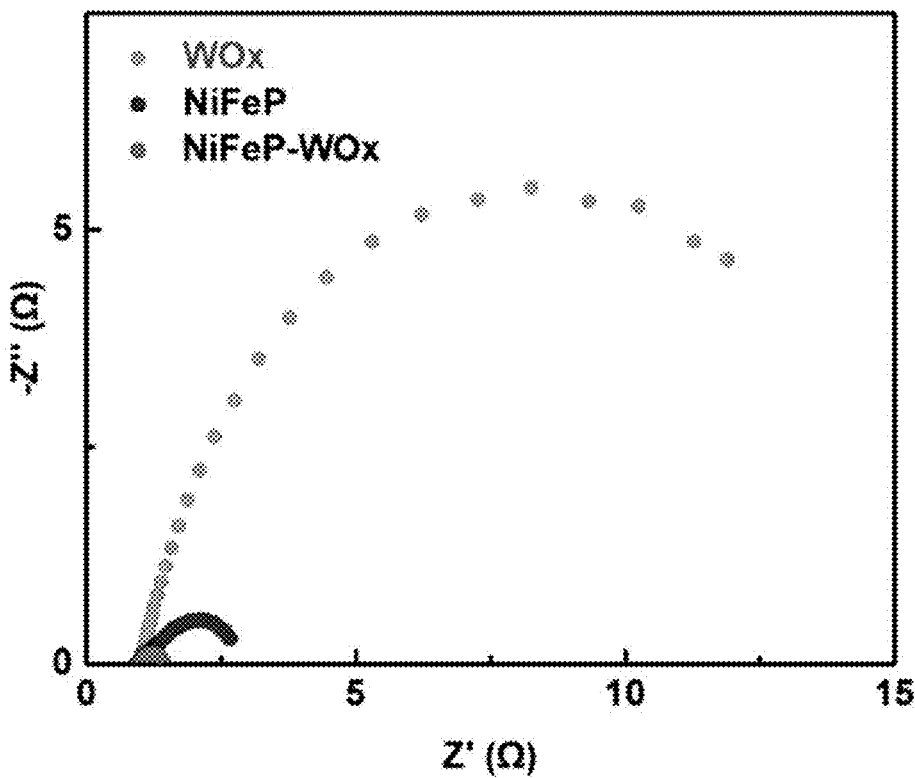

FIGS. 11A to 11F show the oxygen evolution reaction performances of the nanocomposites prepared in Examples 1 and 2 and Comparative Examples 1, 2, and 4: LSV curves of NiFeP—WO$_x$/NF, NiFeP/NF, NiCoP—WO$_x$/NF, NiCoP/NF, WO$_x$/NF, NF, and Ir/NF (FIG. 11A), overpotentials of NiFeP—WO$_x$/NF, Ir/NF, and WO$_x$/NF at 10 and 100 mA/cm$^2$ (FIG. 11B), Tafel plots of NiFeP—WO$_x$/NF, NiFeP/NF, NiCoP—WO$_x$/NF, NiCoP/NF, WO$_x$/NF, and Ir/NF (FIG. 11C), time-dependent overpotential curve of NiFeP—WO$_x$/NF at a current density of 10 mAcm$^2$ for 60 h and LSV curves of NiFeP—WO$_x$/NF before and after 5000 cycles (FIG. 11D), calculated electrochemical surface areas (ECSAs) for NiFeP—WO$_x$/NF and NiFeP/NF (FIG. 11E), and complex-plane impedance plots of NiFeP—WO$_x$/NF, NiFeP/NF, and WO$_x$/NF (FIG. 11F).

Referring to FIG. 11A, Ir/NF, NF, WO$_x$/NF, and NiFeP/NF exhibited overpotential values of 339, 403, 363, and 319 mV, respectively, for generating a current density of 10 mA/cm$^2$. Particularly, the NiFeP—WO$_x$/NF nanocomposite exhibited the lowest overpotential of 270 mV, which was lower than those of the single components WO$_x$/NF and NiFeP/NF. This remarkably enhanced OER activity of the NiFeP—WO$_x$/NF originates from the improved conductivity and numerous active sites. NiCoP—WO$_x$/NF displayed inferior OER performance with a higher overpotential of 336 mV, suggesting that the NiFeP/NF had higher intrinsic OER activity than the NiCoP/NF.

Referring to FIG. 11B, at both current densities of 10 mA/cm$^2$ and 100 mA/cm$^2$, NiFeP—WO$_x$/NF required overpotentials of 270 mA/cm$^2$ and 351 mA/cm$^2$, respectively, which were considerably less than those of Ir/NF (339 mA/cm$^2$ and 524 mA/cm$^2$, respectively), indicating that NiFeP—WO$_x$/NF was much superior to Ir/NF for an oxygen evolution electrode.

Referring to FIG. 11C, the Tafel slope of NiFeP—WO$_x$/NF showed the lowest value of 66 mV/dec among the other catalysts. This low Tafel slope of the NiFeP/NF-containing catalysts exhibits favorable OER kinetics of NiFeP/NF, confirming that the exposed NiFeP NS surface in the nanocomposite is very efficient for the OER.

FIG. 11D shows the overpotential curve of NiFeP—WO$_x$/NF at a fixed current density of 10 mA/cm$^2$ for 60 h, confirming its electrocatalytic stability. In addition, the LSV curve of NiFeP—WO$_x$/NF exhibited a negligible change after 5000 cycles, suggesting the durability of NiFeP—WO$_x$/NF for the alkaline OER.

Referring to FIG. 11E, the ECSA of NiFeP—WO$_x$/NF was 2.77 times higher than that of NiFeP/NF, confirming that NiFeP—WO$_x$/NF had more active sites than NiFeP/NF due to its coral reef structure. Referring to FIG. 11F, the R$_{ct}$ of NiFeP—WO$_x$/NF (1.4Ω) was smaller than that of NiFeP/NF (2.9Ω) and WO$_x$/NF (16.7Ω) during the OER. This result indicates that the NiFeP—WO$_x$/NF catalyst exhibited a more rapid charge transfer than the single components NiFeP/NF and WO$_x$/NF during the OER, confirming the increased conductivity of the nanocomposite.

Experimental Example 3: Analysis of Electrochemical Stabilities and Cyclic Voltammograms of the Ni(Co,Fe)P—WO$_x$/NF Nanocomposites The double-layer capacitance (C$_{dl}$) values were evaluated to compare the electrochemical stability of NiCoP—WO$_x$/NF and NiFeP—WO$_x$/NF for the alkaline HER after 5000 cycles in a three-electrode system and the ECSAs of NiCoP—WO$_x$/NF and NiFeP—WO$_x$/NF. The results are shown in FIGS. 12 and 13.

Figure 12A:
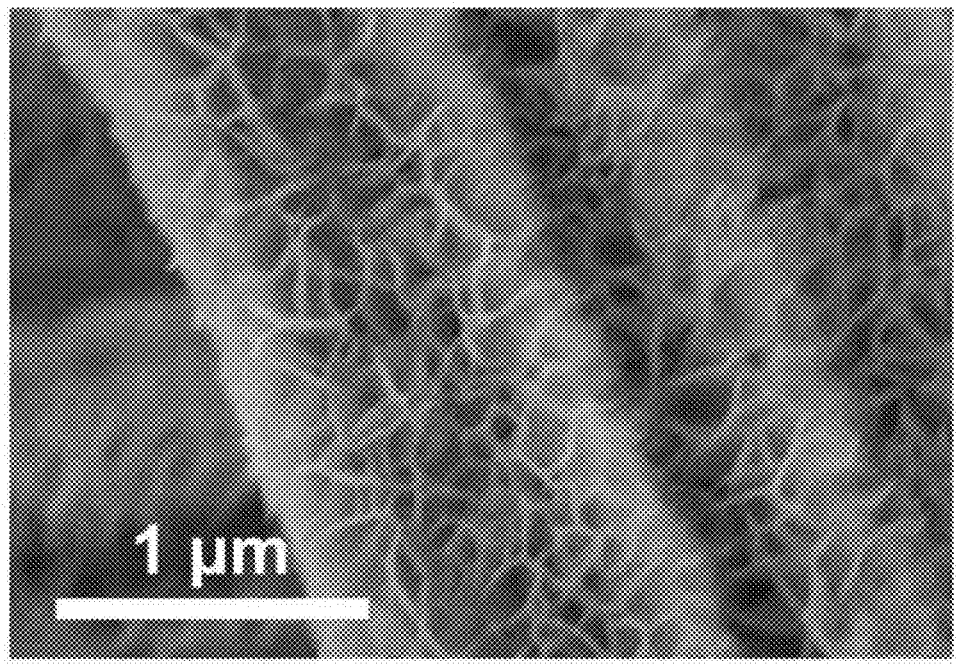
FIGS. 12A and 12B show SEM images of a $NiCoP—WO_x/NF$ nanocomposite prepared in Example 1 (FIG. 12A) and a $NiFeP—WO_x/NF$ nanocomposite prepared in Example 2 after stability testing (FIG. 12B)
Figure 12B:
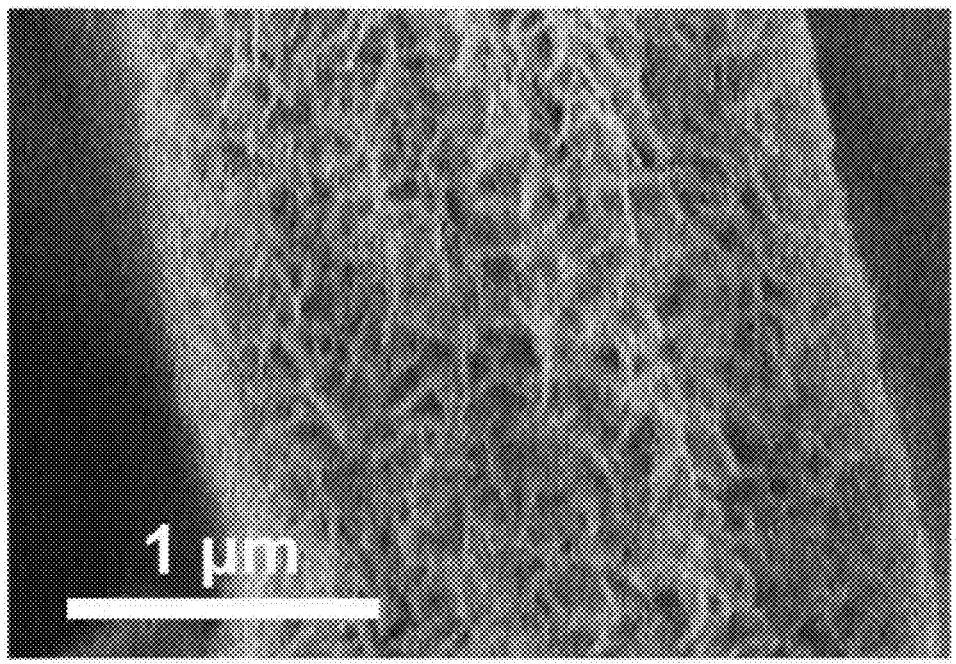
Figure 13A:
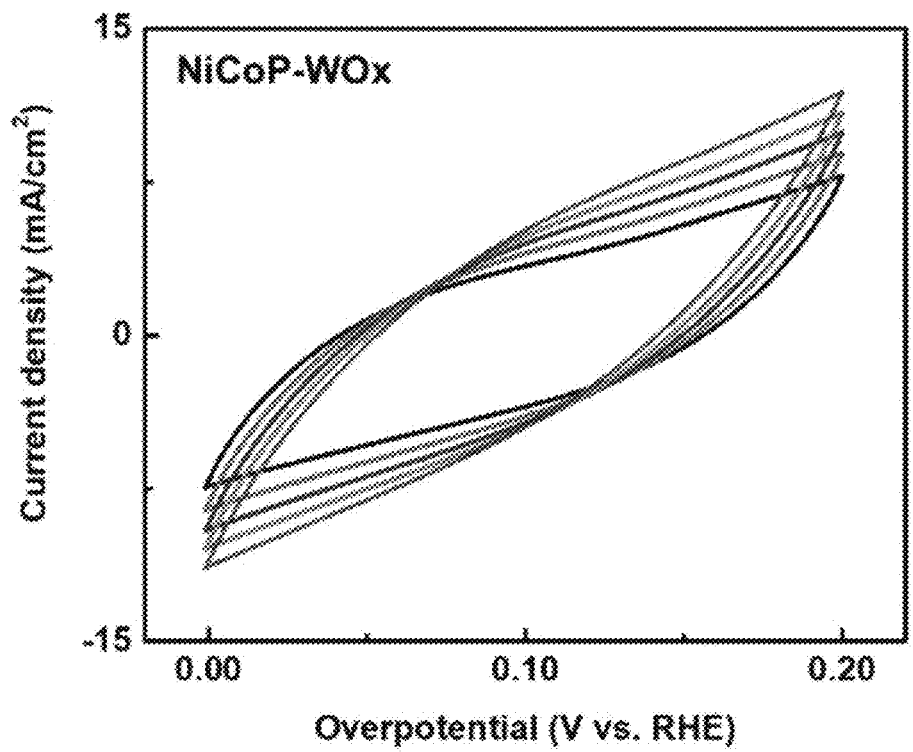
FIGS. 13A to 13D show cyclic voltammograms of $NiCoP—WO_x/NF$ prepared in Example 1 (FIG. 13A and FIG. 13B) and $NiFeP—WO_x/NF$ prepared in Example 2 (FIG. 13C and FIG. 13D) in the non-Faradaic capacitance current range at scan rates of 60, 80, 100, 120 and 140 mV/s.
Figure 13B:
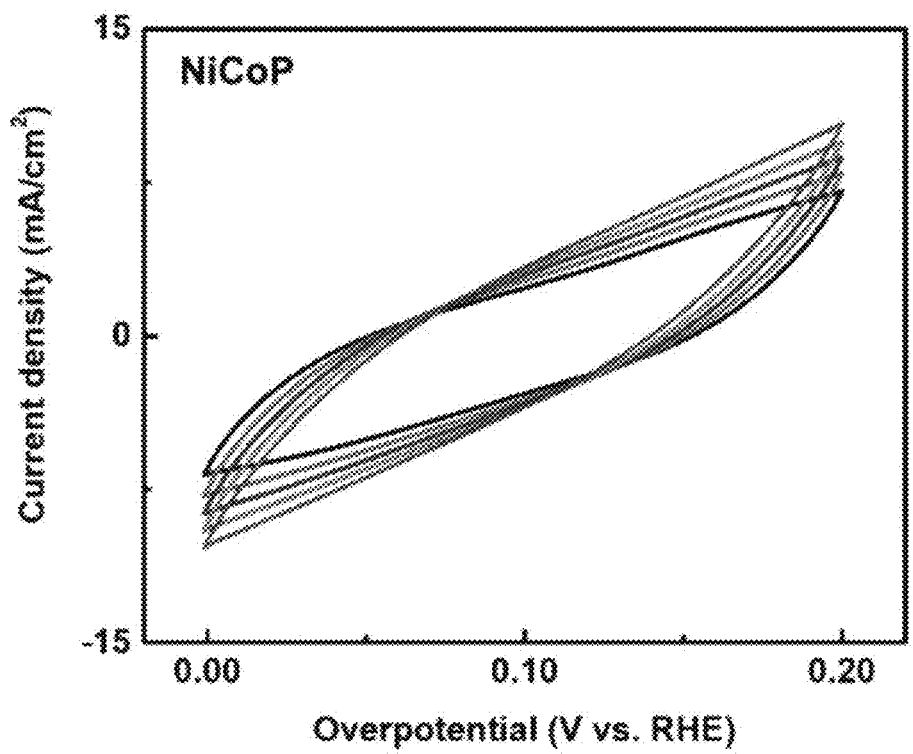
Figure 13C:
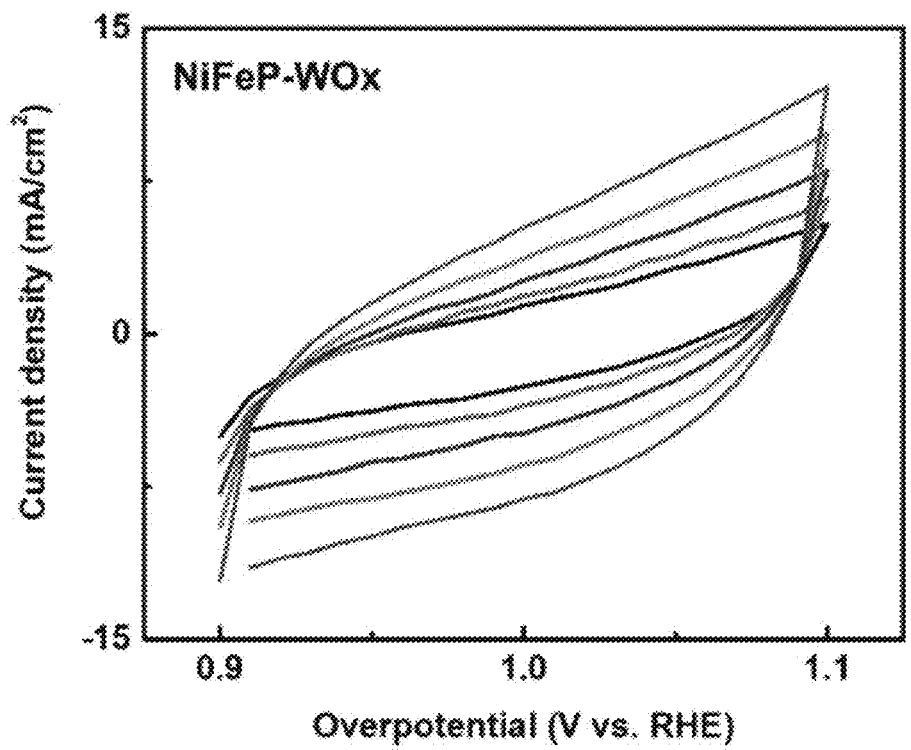
Figure 13D:
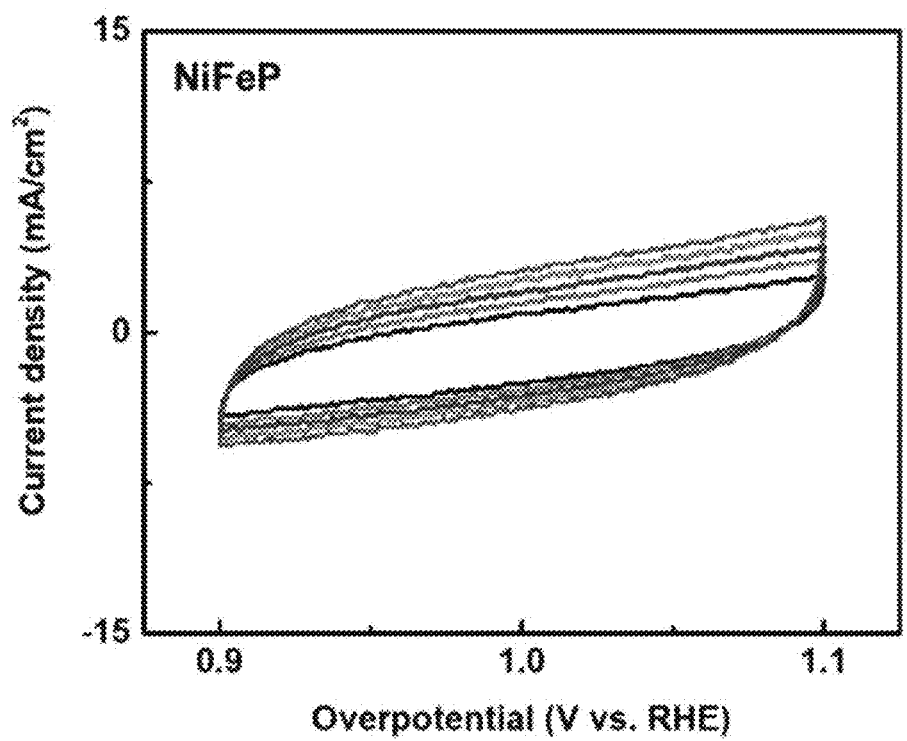

FIGS. 12A and 12B show SEM images of the NiCoP—WO$_x$/NF nanocomposite prepared in Example 1 (FIG. 12A) and the NiFeP—WO$_x$/NF nanocomposite prepared in Example 2 (FIG. 12B) after stability testing. Referring to FIGS. 12A and 12B, the hierarchical nanostructures of NiCoP—WO$_x$/NF and NiFeP—WO$_x$/NF were not degraded during the HER and OER processes, respectively, and the current densities were almost the same even after 5000 cycles, confirming high electrochemical stability.

FIGS. 13A to 13d show cyclic voltammograms of NiCoP—WO$_x$/NF prepared in Example 1 (FIG. 13A and FIG. 13B) and NiFeP—WO$_x$/NF prepared in Example 2 (FIG. 13C and FIG. 13D) in the non-Faradaic capacitance current range at scan rates of 60, 80, 100, 120 and 140 mV/s. Referring to FIGS. 13A to 13D, the measured C$_{dl}$ values of NiCoP—WO$_x$/NF and NiCoP were 36.1 and 22.2 mF/cm$^2$, respectively. The measured C$_{dl}$ values of NiFeP—WO$_x$/NF and NiFeP were 116.8 and 42.1 mF/cm$^2$, respectively. The higher C$_{dl}$ values of NiCoP—WO$_x$/NF and NiFeP—WO$_x$/NF indicate larger catalytically active specific surface areas of the two materials, confirming high performances of the two catalysts.

As described above, the inventive biomimetic Ni(Co,Fe)P—WO$_x$ nanocomposites were synthesized by growing a high density of WO$_x$ NW corals on a nickel foam (NF) by thermal evaporation and electrodepositing Ni(Co,Fe)P NS algae on the WO$_x$ NW corals. The unique hierarchical structure of the Ni(Co,Fe)P—WO$_x$/NF nanocomposites provided a synergistic effect of fast charge transport through numerous active sites provided by the 1D WO$_x$ NW corals and the 2D Ni(Co,Fe)P NS algae. As a result, the Ni(Co,Fe)P—WO$_x$/NF nanocomposites demonstrated excellent catalytic activity. In particular, the NiCoP—WO$_x$/NF nanocomposite exhibited superior HER activity, requiring a low overpotential of 49 mV to generate a current density of 10 mA/cm$^2$ with a small Tafel slope of 50 mV/dec. In addition, the NiCoP—WO$_x$/NF nanocomposite even surpassed that of a Pt catalyst at a high current density of 100 mA/cm$^2$, requiring a lower overpotential (83 mV) than Pt/NF (158 mV).

Regarding the OER, the NiFeP—WO$_x$/NF nanocomposite showed the best OER activity, requiring a low overpotential of 270 mV to generate a current density of 10 mA/cm$^2$ with a small Tafel slope of 66 mV/dec. Both the NiCoP—WO$_x$/NF and NiFeP—WO$_x$/NF nanocomposites exhibited high electrochemical HER and OER stability for over 60 h in 1 M KOH. In conclusion, the Ni(Co,Fe)P—WO$_x$/NF nanocomposites are 1D/2D materials that can be applied to electrocatalysts as well as other energy devices.

What is claimed is:

1. A coral reef-like nickel phosphide-tungsten oxide nanocomposite comprising a substrate, a core comprising a plurality of tungsten oxide structures grown vertically on the substrate, and a shell comprising transition metal-doped nickel phosphide nanosheets covering a portion or the entirety of the surface of the core,
   wherein the shell covering the portion or the entity of the surface of the core together with the core form a hierarchical structure, and
   wherein the tungsten oxide structures are one-dimensional directional structures having a micron scale average length and thickness,
   wherein the tungsten oxide structures have an average length of 20 to 100 μm;
   wherein the transition metal-doped nickel phosphide nanosheets have a structure in which a portion or the entirety of the surface of the nickel phosphide nanosheets is doped with at least one transition metal selected from the group consisting of Co and Fe.

2. The coral reef-like nickel phosphide-tungsten oxide nanocomposite according to claim 1, wherein the substrate is a nickel foam.

3. The coral reef-like nickel phosphide-tungsten oxide nanocomposite according to claim 1, wherein the tungsten oxide structures are in the form of wires, tubes or rods.

4. The coral reef-like nickel phosphide-tungsten oxide nanocomposite according to claim 1, wherein the tungsten oxide structures have a thickness of 0.5 to 10 μm.

5. The coral reef-like nickel phosphide-tungsten oxide nanocomposite according to claim 1, wherein the tungsten oxide structures have an interplanar distance (d-spacing) of 0.1 to 0.6 nm, as measured by X-ray diffraction.

6. The coral reef-like nickel phosphide-tungsten oxide nanocomposite according to claim 1, wherein the transition metal is doped in an amount of 1 to 10 atomic %, based on 100 atomic % of the coral reef-like nickel phosphide-tungsten oxide nanocomposite.

7. The coral reef-like nickel phosphide-tungsten oxide nanocomposite according to claim 1, wherein the nickel phosphide of the transition metal-doped nickel phosphide nanosheets is NiP, $Ni_2P$ or a mixture thereof.

8. The coral reef-like nickel phosphide-tungsten oxide nanocomposite according to claim 1, wherein the amount of metal atoms in the shell is 25 to 45 atomic %, based on 100 atomic % of the coral reef-like nickel phosphide-tungsten oxide nanocomposite.

9. A catalyst for electrochemical water splitting comprising the coral reef-like nickel phosphide-tungsten oxide nanocomposite according to claim 1.

10. The catalyst according to claim 9, wherein the catalyst is for the hydrogen evolution reaction or oxygen evolution reaction.

11. An electrode comprising the catalyst according to claim 9.

12. An electrochemical water splitting system comprising the electrode according to claim 11, a counter electrode, and an electrolyte or ionic liquid.

13. A method for preparing a coral reef-like nickel phosphide-tungsten oxide nanocomposite according to claim 1, comprising:
(A) introducing a tungsten oxide precursor on a substrate, followed by primary thermal treatment under vacuum conditions to form a core comprising a plurality of tungsten oxide structures grown along a vertical direction on the substrate;
(B) introducing a nickel precursor and a transition metal precursor on the tungsten oxide structures, followed by electrodeposition to form a nickel hydroxide-tungsten oxide intermediate in which a shell comprising transition metal-doped nickel hydroxide nanosheets is deposited on the tungsten oxide structures; and
(C) introducing a phosphorus precursor into the nickel hydroxide-tungsten oxide intermediate, followed by secondary thermal treatment.

14. The method according to claim 13, wherein the substrate is a nickel foam.

15. The method according to claim 13, wherein the tungsten oxide precursor is selected from the group consisting of $WO_3$, $WO_2$, $W_{18}O_{49}$, and mixtures thereof.

16. The method according to claim 13, wherein the core comprising tungsten oxide structures is grown by thermal evaporation.

17. The method according to claim 16, wherein the thermal evaporation is performed for 30 minutes to 2 hours after heating to 800 to 1200° C. at a ramp rate of 10 to 25° C./min under a vacuum of 0.07 mbar or less.

18. The method according to claim 13, wherein the nickel precursor is selected from the group consisting of nickel acetate, nickel halides, nickel nitrate, nickel chloride hexahydrate, nickel carbonyl complexes, and mixtures thereof.

19. The method according to claim 13, wherein the transition metal precursor is $MCl_x \cdot 6H_2O$ or $M(NO_3)_x \cdot 6H_2O$ (where M is Fe, Co, Mo or V and x is $1 \leq x \leq 10$).

20. The method according to claim 13, wherein the nickel precursor and the transition metal precursor are mixed in a molar ratio of 1:1 to 6:1.

21. The method according to claim 13, wherein the electrodeposition is performed at −1.1 to −0.9 V for 250 to 350 seconds in the step (B).

22. The method according to claim 13, wherein the phosphorus precursor is selected from the group consisting of sodium hypophosphite ($NaPO_2H_2 \cdot H_2O$), phosphate ($H_3PO_4$), monoammonium phosphate ($NH_4H_2PO_4$), diammonium phosphate (($NH_4)_2HPO_4$), triethylphosphine (($C_2H_5)_3P$), trimethylphosphine (($CH_3)_3P$), and mixtures thereof.

23. The method according to claim 13, wherein the transition metal is doped in an amount of 1 to 10 atomic %, based on 100 atomic % of the coral reef-like nickel phosphide-tungsten oxide nanocomposite.

24. The method according to claim 13, wherein the amount of metal atoms in the shell is 25 to 45 atomic %, based on 100 atomic % of the coral reef-like nickel phosphide-tungsten oxide nanocomposite.

25. The method according to claim 13, wherein the secondary thermal treatment is performed for phosphorization under an inert atmosphere at 100 to 500° C. for 1 to 3 hours.

26. The method according to claim 13, wherein the substrate is a nickel foam, the tungsten oxide precursor is $WO_3$, the tungsten oxide structures are grown by thermal evaporation for 50 to 70 minutes after heating to 1000 to 1100° C. at a ramp rate of 17 to 18° C./min under a vacuum of 0.06 mbar or less, the tungsten oxide structures have an average length of 45 to 55 μm and a thickness of 1.5 to 2.5 μm, the tungsten oxide structures have an interplanar distance (d-spacing) of 0.31 to 0.42 nm, as measured by X-ray diffraction, the nickel precursor is nickel chloride hexahydrate, the transition metal precursor is $FeCl_3 \cdot 6H_2O$ or $CoCl_2 \cdot 6H_2O$, the nickel precursor and the transition metal precursor are mixed in a molar ratio of 2:1 to 4:1, the nickel hydroxide-tungsten oxide intermediate is formed by electrodeposition at −1.1 to −0.9 V for 250 to 350 seconds, the phosphorus precursor is sodium hypophosphite ($NaPO_2H_2 \cdot H_2O$), the secondary thermal treatment is performed for phosphorization under an inert atmosphere at 280 to 320° C. for 1.8 to 2.2 hours, the amount of the transition metal doped is 3.31 to 7.22 atomic %, based on 100 atomic % of the coral reef-like nickel phosphide-tungsten oxide nanocomposite, and the amount of metal atoms in the shell is 36 to 40 atomic %, based on 100 atomic % of the coral-like nickel phosphide-tungsten oxide nanocomposite.

\* \* \* \* \*